United States Patent
Kawasaki et al.

(10) Patent No.: US 6,656,781 B2
(45) Date of Patent: Dec. 2, 2003

(54) METHOD OF MANUFACTURING A SEMICONDUCTOR DEVICE, HAVING FIRST AND SECOND SEMICONDUCTOR REGIONS WITH FIELD SHIELD ISOLATION STRUCTURES AND A FIELD OXIDE FILM COVERING A JUNCTION BETWEEN SEMICONDUCTOR REGIONS

(75) Inventors: Atsushi Kawasaki, Tokyo (JP); Kohei Eguchi, Tokyo (JP); Katsuki Hazama, Tokyo (JP); Fumitaka Sugaya, Tokyo (JP)

(73) Assignee: Nippon Steel Corporation (JP)

( * ) Notice: Subject to any disclaimer, the term of this patent is extended or adjusted under 35 U.S.C. 154(b) by 0 days.

(21) Appl. No.: 10/263,133

(22) Filed: Oct. 3, 2002

(65) Prior Publication Data

US 2003/0027384 A1 Feb. 6, 2003

Related U.S. Application Data

(62) Division of application No. 09/725,714, filed on Nov. 30, 2000, now Pat. No. 6,482,692, which is a division of application No. 08/667,587, filed on Jun. 24, 1996, now Pat. No. 6,201,275.

(30) Foreign Application Priority Data

Jun. 30, 1995 (JP) .......................... 07-188253
Sep. 14, 1995 (JP) .......................... 07-262162

(51) Int. Cl.$^7$ ..................... H01L 21/8238; H01L 21/76
(52) U.S. Cl. ..................... 438/218; 438/275; 438/241; 438/454

(58) Field of Search ............................... 438/218, 275, 438/257, 258, 454, 241

(56) References Cited

U.S. PATENT DOCUMENTS

| | | | |
|---|---|---|---|
| 4,652,898 A | | 3/1987 | Lange et al. |
| 4,905,023 A | | 2/1990 | Suzuki |
| 5,150,178 A | | 9/1992 | Mori |
| 5,164,803 A | | 11/1992 | Ozaki et al. |
| 5,164,806 A | * | 11/1992 | Nagatomo et al. .......... 257/395 |
| 5,181,094 A | | 1/1993 | Eimori et al. |
| 5,183,773 A | | 2/1993 | Miyata |
| 5,188,976 A | | 2/1993 | Kume et al. |
| 5,290,725 A | | 3/1994 | Tanaka et al. |
| 5,510,638 A | * | 4/1996 | Lancaster et al. ........... 257/314 |
| 5,672,526 A | | 9/1997 | Kawamura |
| 5,698,902 A | * | 12/1997 | Uehara et al. .............. 257/773 |

FOREIGN PATENT DOCUMENTS

| | | |
|---|---|---|
| JP | 56-70644 | 1/1981 |
| JP | 63-305548 | 12/1988 |
| JP | 61-75555 | 6/1994 |

* cited by examiner

Primary Examiner—Michael Trinh
(74) Attorney, Agent, or Firm—Connolly, Bove, Lodge & Hutz LLP

(57) ABSTRACT

A semiconductor device has, in one embodiment, two wells of different conductivity types formed in a semiconductor substrate. The two wells are arranged to be adjacent to each other to form a junction therebetween. A field oxide film is formed to cover the junction at a main surface of the semiconductor substrate. Other field oxide films or field-shield isolation structures may be formed to isolate circuit elements from one another in the wells.

2 Claims, 13 Drawing Sheets

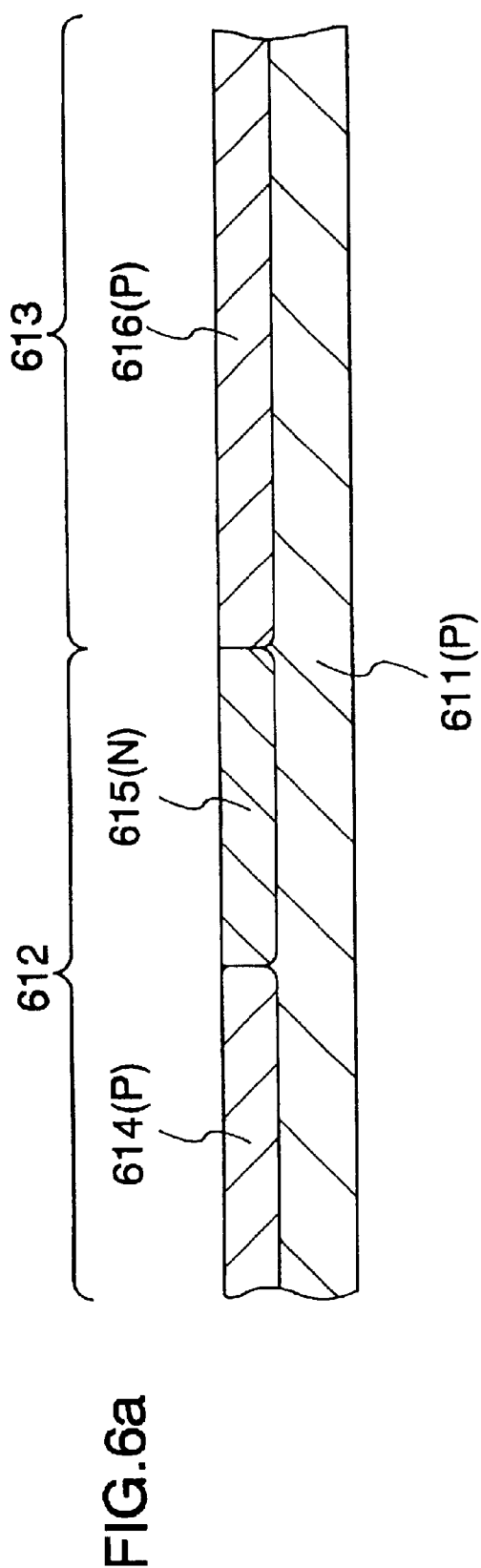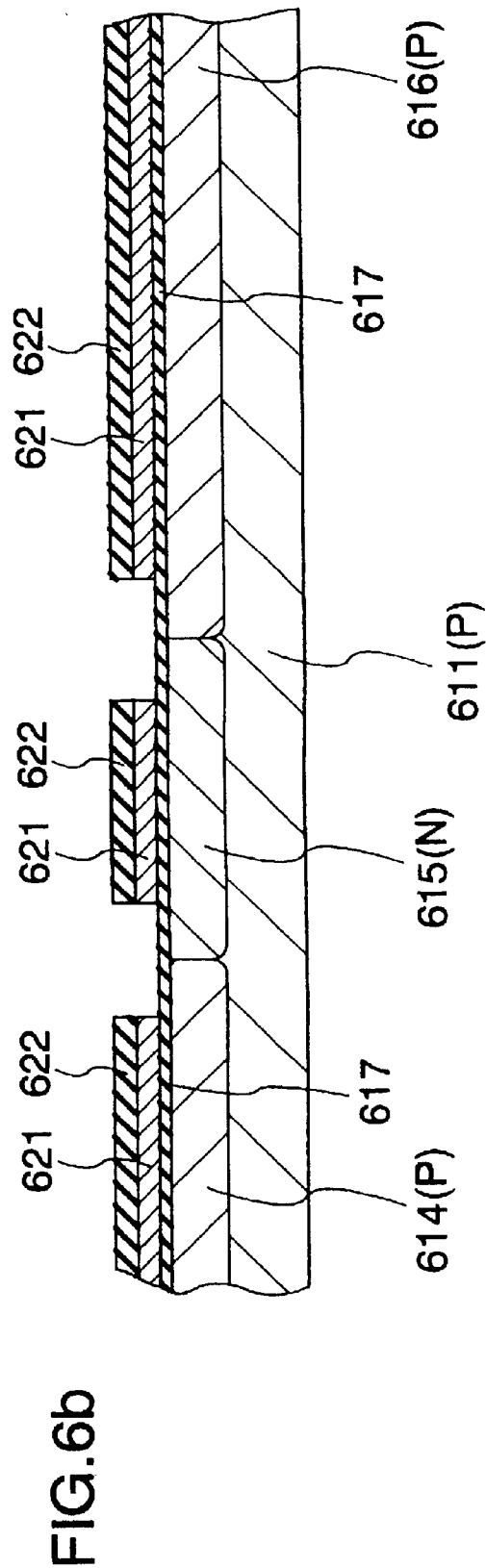
FIG.6a
FIG.6b

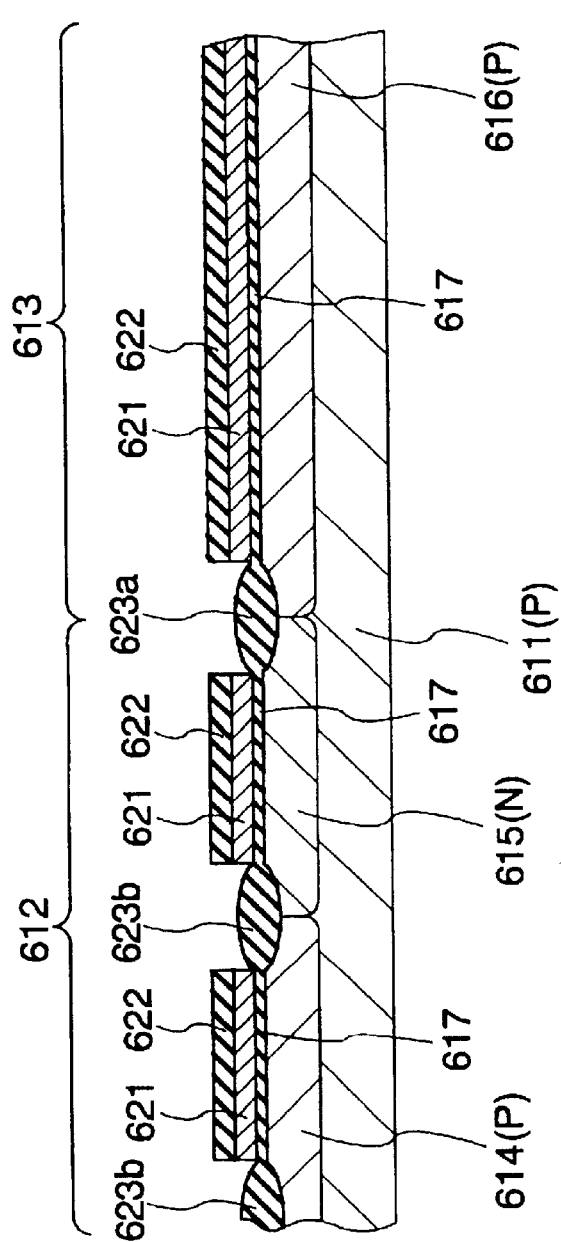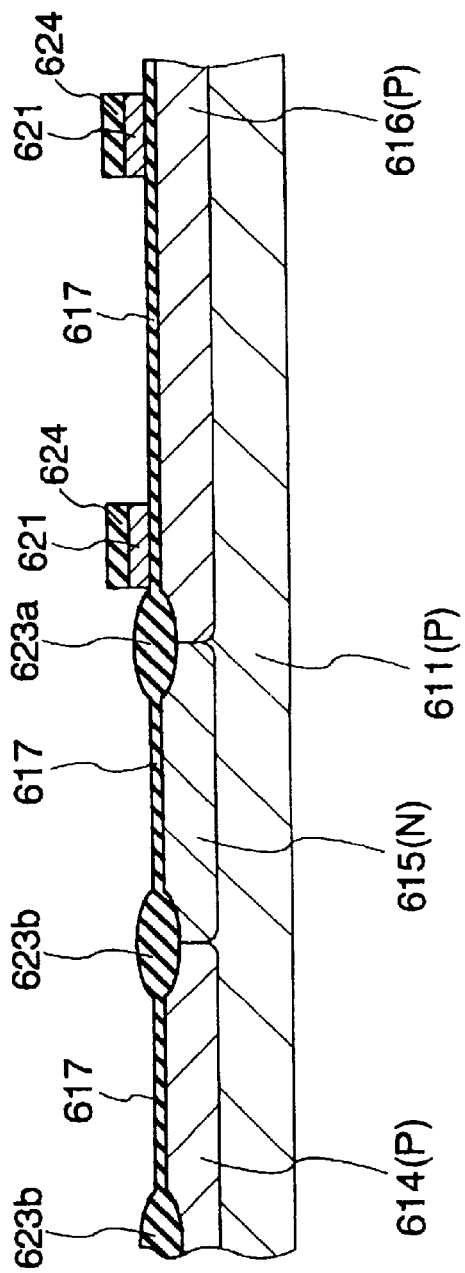
FIG.6c
FIG.6d

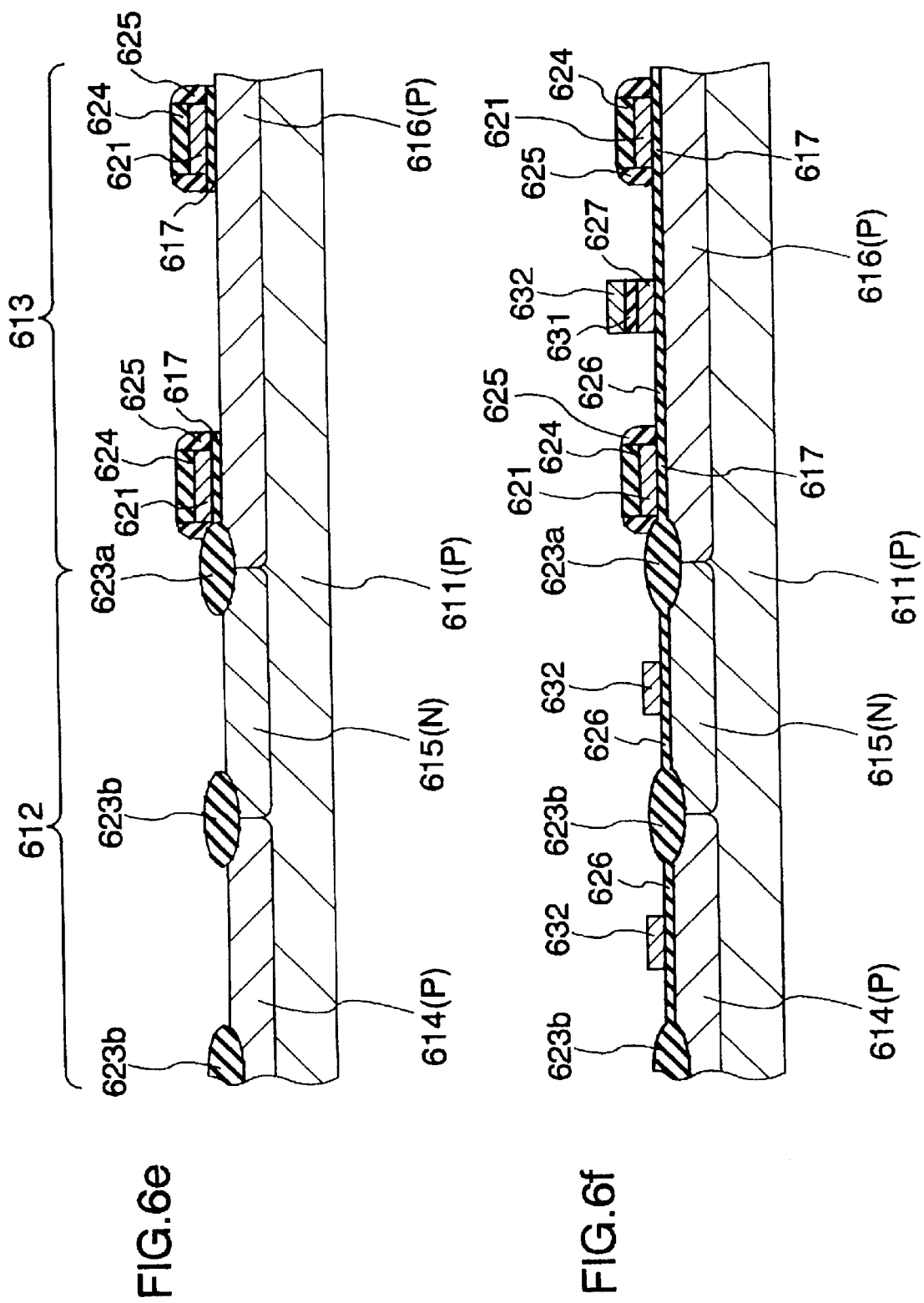

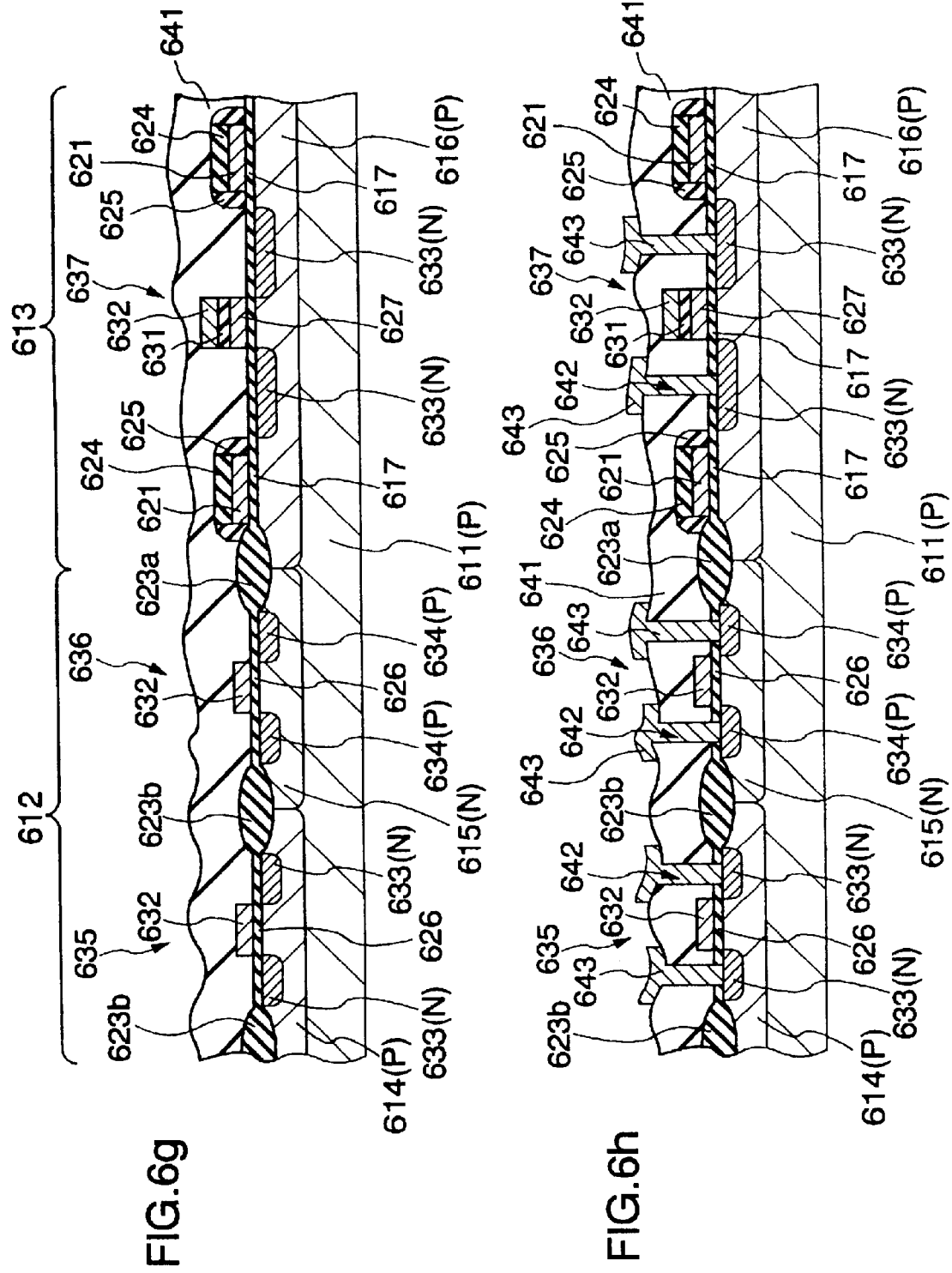

METHOD OF MANUFACTURING A SEMICONDUCTOR DEVICE, HAVING FIRST AND SECOND SEMICONDUCTOR REGIONS WITH FIELD SHIELD ISOLATION STRUCTURES AND A FIELD OXIDE FILM COVERING A JUNCTION BETWEEN SEMICONDUCTOR REGIONS

This application is a divisional of application Ser. No. 09/725,714, filed Nov. 30, 2000 U.S. Pat. No. 6,482,692, which is a divisional of application Ser. No. 08/667,587, filed on Jun. 24, 1996, U.S. Pat. No. 6,201,275.

BACKGROUND OF THE INVENTION

This invention relates to a semiconductor device and a method of manufacturing the same. More particularly, the present invention relates to an isolation technology in semiconductor devices such as a DRAM, an EEPROM, etc.

With further miniaturization of elements in semiconductor devices, an isolation method has become one of the critical problems to be overcome. A method known as local oxidation of silicon (LOCOS) has been widely used as the isolation method. When isolation is carried out by this LOCOS method, however, bird's beaks develop and limit the area of forming elements such as transistors. Therefore, this method cannot easily satisfy a higher integration density of semiconductor devices required recently. A so-called "field-shield isolation" method, which isolates elements by a MOS structure formed on a semiconductor substrate, has been proposed as an isolation method which does not generate the bird's beaks.

Generally, the field-shield isolation structure has a MOS structure in which shield gate electrodes made of a poly-crystalline silicon (poly-silicon) film are formed over a silicon substrate through a shield gate oxide film. This shield gate electrode is always kept at a constant potential of 0 V, for example, as it is grounded (GND) through a connection conductor when the silicon substrate (or a well region) has a P type conductivity. When the silicon substrate (or the well region) has an N type conductivity, the shield gate electrode is always kept at a predetermined potential (a power source potential Vcc [V], for example).

As a result, because the formation of a channel of a parasitic MOS transistor on the surface of the silicon substrate immediately below the shield gate electrode can be prevented, adjacent elements such as transistors can be electrically isolated from one another. According to this field-shield isolation, ion implantation for forming the channel stopper which has been necessary for the LOCOS is not necessary. In consequence, a narrow channel effect of the transistor can be reduced and the substrate concentration can be lowered, so that the junction capacitance formed inside the substrate becomes small, and the operation speed of the transistor can be improved.

JP-A-61-75555 (laid-open on Apr. 17, 1986 and corresponding to U.S. Ser. No. 626,572 filed Jul. 2, 1984 with U.S. PTO) discloses a semiconductor device employing a field-shield structure or field oxide film for isolation between elements.

JP-A-63-305548 (laid-open on Dec. 13, 1988) discloses a semiconductor device in which a field oxide film is formed on an n-type semiconductor region and a field-shield structure is formed on a p-type semiconductor region.

SUMMARY OF THE INVENTION

As a result of researches and investigations conducted by the present inventors, it has been found with the field-shield isolation structure that inconveniences are encountered when it is required to form wells to be fixed or kept at different potentials for the purpose of forming a circuit such as a CMOS circuit, as will be described below.

Generally, in a CMOS circuit, a P-type well in which an N-type MOS transistor is formed is kept at the ground potential, while an N-type well in which a P-type MOS transistor is formed is kept at a power supply potential. Thus, a shield gate electrode for isolation of the N-type MOS transistor in the P-type well must be also kept at the ground potential, and a shield gate electrode for isolation of the P-type MOS transistor in the N-type well must be also kept at the power supply potential for isolation of the transistor elements. Therefore, it is impossible to directly connect to either a shield electrode for the N-type well or a shield electrode for the P-type well a shield gate electrode which serves to isolate elements near a junction between the P-type well and the N-type well, one in the P-type well and the other in the N-type well. This necessitates formation of an isolating active region at the junction of the N-type and P-type wells. As a result, direct connection of the gates of the N-type and P-type MOS transistors with a poly-silicon becomes impossible, and additional connection conductors have to be provided at a higher level for the connection of the gates of the transistors.

Due to the above-mentioned structural limitations, a large area is needed to impede a high integration of the circuit, and further reliability of a multi-layer connection structure need to be ensured, which will make the production cost higher.

It is therefore an object of the present invention to provide a semiconductor device having an isolation structure which is useful for integrating semiconductor elements or circuit elements at a high integration density and reducing a chip area, and a method of manufacturing such a semiconductor device.

It is another object of the present invention to provide a semiconductor device in which two element formation regions or semiconductor regions having different conductivity types can be isolated from each other by an isolation structure having a smaller size than those of the prior art devices, and a method of manufacturing such a semiconductor device.

It is still another object of the present invention to provide a semiconductor device in which electrical connection is possible between elements formed at the boundary between two element formation regions or semiconductor regions having different conductivity types by an integrated (single) connection conductor, and a method of manufacturing such a semiconductor device.

According to one aspect of the present invention, a field oxide film is formed at a main surface of a semiconductor substrate, the field oxide film having an inner surface located within the semiconductor substrate, and a junction formed between two semiconductor regions of different conductivity types defined in the semiconductor substrate terminates at the inner surface of the field oxide film. By this structure, the semiconductor regions of different conductivity types are isolated from each other, and it is possible to form a conductor extending on the isolating field oxide film for making electrical connection between circuit elements in the isolated semiconductor regions.

According to another aspect of the present invention, in a semiconductor device of the type in which a first well region of a first conductivity type and a second well region of a second conductivity type, that are fixed at mutually different potentials, are formed adjacent to each other in a surface portion of a semiconductor region and a plurality of MOS transistors each having source/drain regions of an opposite conductivity type to that of each well are formed in at least one of the first and second regions, these MOS transistors are electrically isolated from one another by a field-shield isolation structure and the first and second regions are electrically isolated from each other by a first field oxide film.

According to still another aspect of the present invention, in a semiconductor device including a plurality of well regions formed in a surface portion of a semiconductor substrate, these well regions are electrically isolated from each other and from the semiconductor substrate by a field oxide film, and isolation of other elements is attained by field-shield isolation structures.

BRIEF DESCRIPTION OF THE DRAWINGS

FIGS. 6a to 6h are sectional views showing step-wise a method of manufacturing a semiconductor device according to a sixth embodiment of the present invention.

DESCRIPTION OF THE PREFERRED EMBODIMENTS

Figure 1:
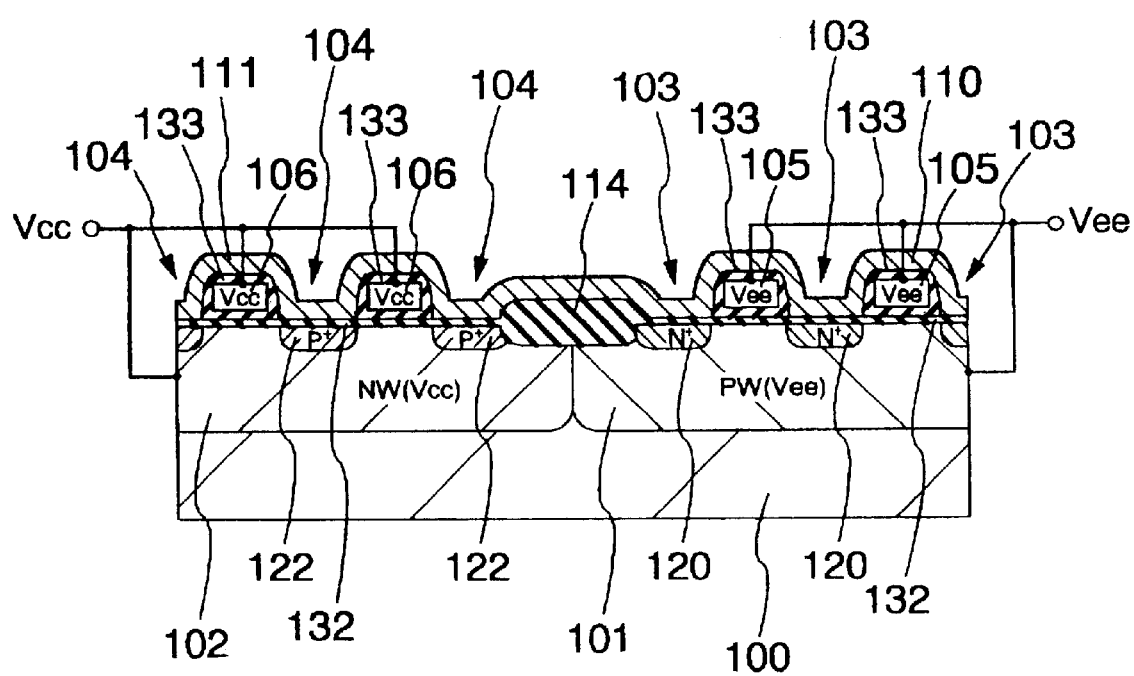
FIG. 1 is a sectional view of a semiconductor device according to a first embodiment of the present invention.
Figure 8:
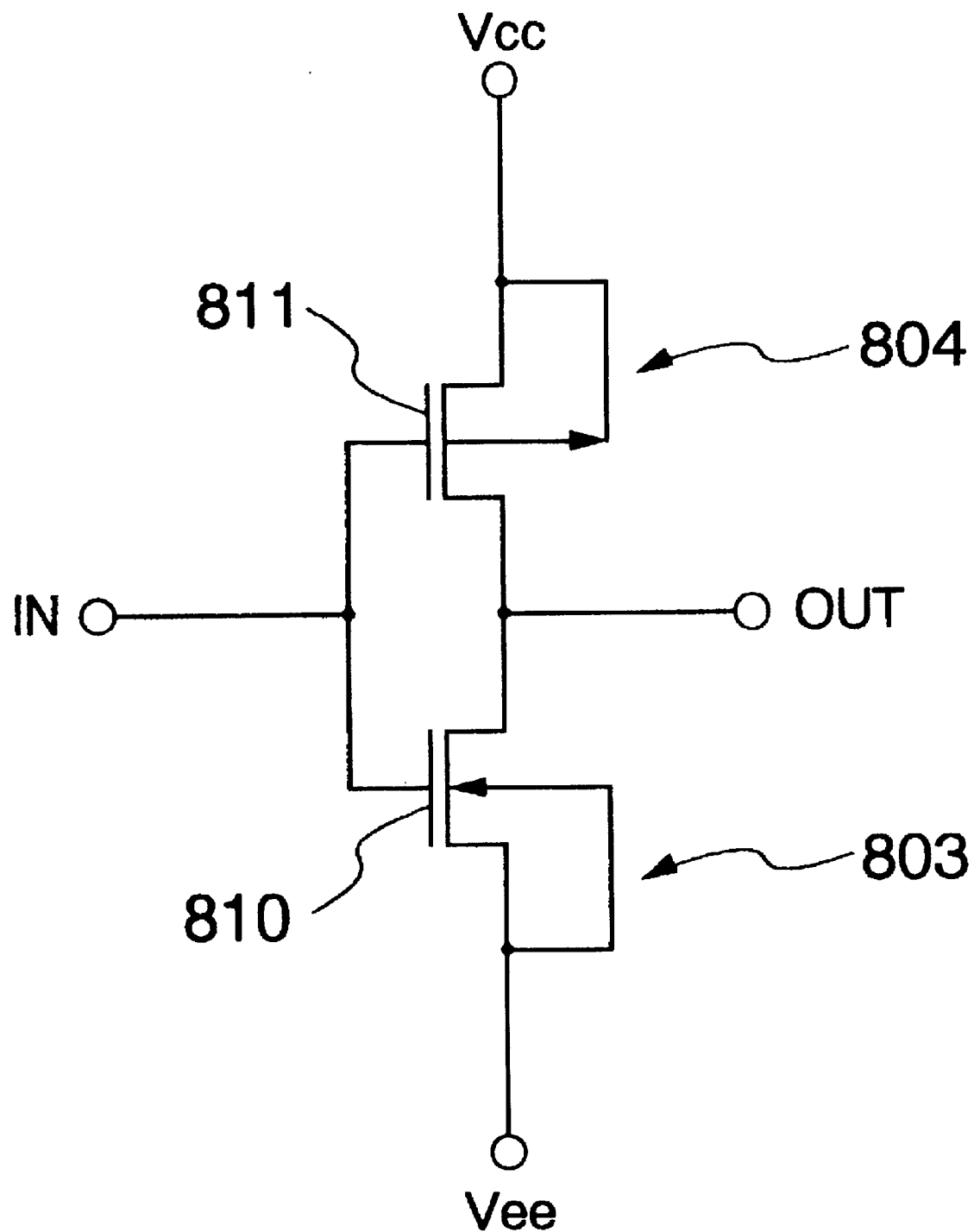
FIG. 8 is an equivalent circuit diagram of a CMOS circuit of FIG. 1.

First, a semiconductor device inclusive of a CMOS circuit of FIG. 8 according to a first embodiment of the present invention will be explained with reference to FIG. 1 which is a schematic sectional view. In FIG. 1, a P well (PW) 101 kept at a common potential or a ground potential Vee and an N well (NW) 102 kept at a power source potential Vcc are shown formed inside a silicon substrate 100 having a main surface. N type MOS transistors 103 (803) are formed in the P well 101 and P type MOS transistors 104 (804) are formed in the N well 102.

Each of the N type MOS transistors 103 includes a gate electrode 110 (810) comprising a phosphorus-doped polysilicon film which is formed on the P well 101 through a gate oxide film 132 and has a film thickness of about 100 to about 300 nm, and a pair of D type impurity diffusion layers 120 (only one of them being shown in FIG. 1) are formed inside the surface of P wells 101 on both sides of the gate electrode 110 to serve as the source and the drain. Incidentally, reason why only one of each pair of N type impurity diffusion layers 120 is shown in FIG. 1 is because this drawing is a sectional view along the gate electrode 110 (810) and the other N type impurity diffusion layer 120 does not appear. This also holds true to the latterappearing P type impurity diffusion layers 122.

The N type MOS transistors 103 are isolated by a field-shield isolation structure having a shield gate electrode 105 having a film thickness of about 300 to about 500 nm and crossing at right angles a gate electrode 110. The shield gate electrode 105 whose periphery is covered with a silicon dioxide film 133 comprising a sidewall oxide film and a cap oxide film has its potential kept at the common potential such as a ground potential Vee. Since the formation of a parasitic channel in the P well 101 immediately below the shield gate electrode 105 can be thus prevented, the adjacent N type MOS transistors 103 can be electrically isolated from one another.

Each of the P type MOS transistors 104 includes a gate electrode 111(811) comprising a phosphorus doped polysilicon film formed on the N well 102 through a gage oxide film 132, and having a film thickness of about 100 to about 300 nm. A pair type impurity diffusion layers 122 is formed inside the surface portions of the N wells 102 on both sides of the gate electrode 111(811) to serve as the source and the drain (only one of them being shown in FIG. 1).

The P type MOS transistors 104 are isolated by a field-shield isolation structure having an about 300 to about 500 nm-thick shield gate electrode 106 having a pattern crossing orthogonally the gate electrodes 111. The shield gate electrode 106 whose periphery is covered with a silicon dioxide film 133 comprising a sidewall oxide film and a cap oxide film has its potential kept at a power source potential Vcc. Since the formation of a parasitic channel in the N well 102 immediately below the shield gate electrode 106 can be thus prevented, the adjacent P type MOS transistors 104 can be electrically isolated from one another.

As described above, in the semiconductor device according to this embodiment, a plurality of N type MOS transistors 103 formed in the P well 101 and a plurality of P type MOS transistors 104 formed in the N well 102 can be electrically isolated from one another by the field-shield isolation structure which does not invite the occurrence of the bird's beaks that have been observed in the LOCOS method. Therefore, a greater area can be secured for the active region of each well 101, 102 than when isolation is attained by the LOCOS method. In other words, the MOS transistors 103 and 104 can be formed in a higher integration density, and a semiconductor device having the CMOS structure can be highly integrated. Because ion implantation into the element isolation regions for forming the channel stopper, which has been necessary in the LOCOS method, is not required, the narrow channel effect of the MOS transistors 103 and 104 can be reduced, the concentration of each well 101, 102 can be lowered and the junction capacity can be made small. Consequently, the MOS transistors 103 and 104 can be operated at a high operation speed.

In the semiconductor device according to this embodiment, the field oxide film 114 having a film thickness of about 150 to about 500 nm is formed in such a manner as to bridge the P well 101 and the N well 102 or in other words, to cross over the PN junction therebetween. The field oxide film has an inner surface located inside or within the substrate 100. The film thickness is decided in such a manner that an inversion layer is not formed at the position immediately below the oxide film 114. This field oxide film 114 can be formed by the LOCOS method. The PN junction terminates at the inner surface of the field oxide film 114. The P well 101 and the N well 102 are electrically isolated from one another by forming the thick field oxide film 114. In other words, since the field oxide film 114 is formed to a sufficiently large thickness, it is possible to prevent the formation of the channel below the field oxide film 114 and the operation of the parasitic transistor even when the potential of a connection conductor (e.g. gate electrodes 110 and 111) formed on this field oxide film 114 changes. Therefore, even when a P type impurity diffusion layer having a relatively high impurity concentration is not formed as has been made in the prior art, the P well 101 and the N well 102 can be electrically isolated from one another, and the width necessary for isolation can be reduced by far greatly than in the prior art. Therefore, a semiconductor device having a CMOS structure can be integrated in a higher integration density.

In the semiconductor device according to this embodiment, the active region to which a voltage for keeping the potentials of the wells is applied is not formed inside the P wells 101 and the N well 102 formed adjacent to one another so as to form the PN junction. Therefore, the CMOS circuit can be constituted by directly connecting the gate electrode 110 of each N type MOS transistor 103 and the gate electrode 111 of each P type MOS transistor 104 by the conductor extending on the field oxide film 114 (or in other words, integrally forming the two gate electrodes 110 and 111). For this reason, a troublesome process step of leading out the two gate electrodes 110 and 111 and indirectly connecting them by a leading-out electrode, etc., becomes unnecessary. Because the number of portions of multi-layered wiring decreases, reliability of wiring connection can be improved. Incidentally, power source means not shown in FIG. 1 supplies the ground potential Vee and the power source potential Vcc.

As described above, the semiconductor device according to this embodiment uses the field-shield isolation structure to electrically isolate a plurality of MOS transistors 103 and 104 formed in the P well 101 and the N well 102 from one another, respectively, and uses the field oxide film 114 to electrically isolate the two wells 101 and 102 from each other. Therefore, the area necessary for isolation can be reduced in each of the wells 101 and 102 and in the well boundary region. In other words, because the MOS transistors 103 and 104 can be formed in a higher integration density, the integration density of the semiconductor device can be improved.

The semiconductor device shown in FIG. 1 can be fabricated by the steps of forming first the two wells 101 and 102 by ion implantation, forming then the field oxide film 114 by the LOCOS method, further forming the field-shield isolation structure by CVD or thermal oxidation, and integrally patterning the gate electrodes 110 and 111. Because the field-shield isolation structure is formed in this way after the field oxide film 114 is formed, the peripheral portions of the shield gate electrodes 105 and 106 are prevented from being oxidized by the heat-treatment during the LOCOS process. However, if design is made in advance by taking into consideration the decrement of the widths of the shield gate electrodes 105 and 106 by this thermal oxidation, the field oxide film 114 can be formed after the field-shield isolation structure is formed.

Next, the semiconductor device according to the second embodiment of the present invention will be explained with reference to FIG. 2 which is a schematic sectional view of the semiconductor device. This embodiment represents the application of the present invention to a DRAM having a CMOS circuit in a peripheral circuit region.

Figure 2:
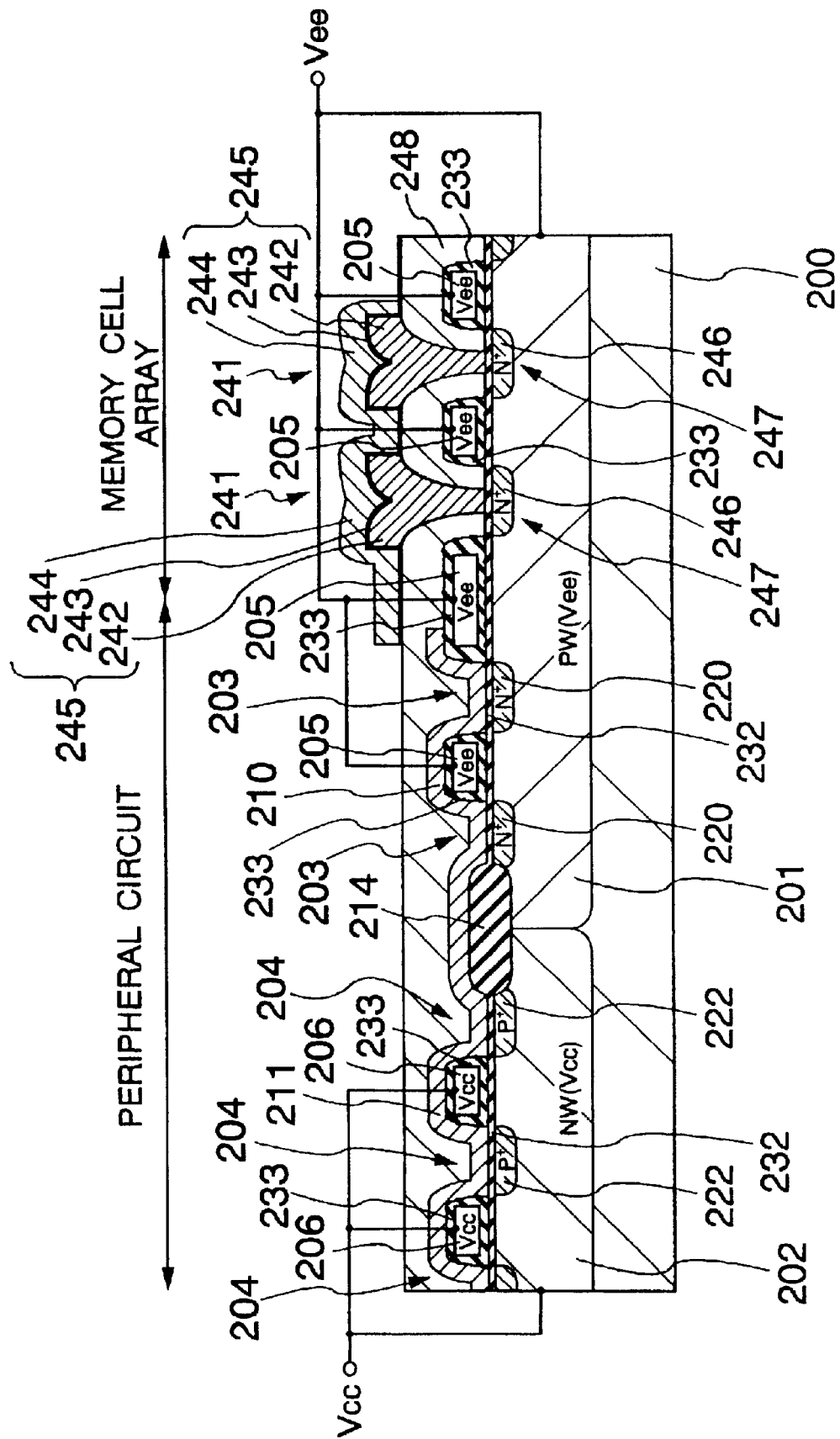
FIG. 2 is a sectional view of a typical DRAM according to a second embodiment of the present invention.

Referring to FIG. 2, a P well (PW) 201 kept at the common potential or the ground potential Vee and an N well (NW) 202 kept at the power source potential Vcc are shown formed inside a silicon substrate 200 having a main surface. P type MOS transistors 204 constituting a peripheral circuit are formed in the N well 202. N type MOS transistors 203 constituting a peripheral circuit and DRAM memory cells 241 constituting a memory cell array are formed in the P well 201. The DRAM memory cell 241 comprises a capacitor 245 which in turn comprises a lower electrode 242 formed on the inter-level insulating film 248 and comprising a poly-silicon film, a capacitance dielectric film 243 covering the lower electrode 242 and comprising an ONO film, and an upper electrode 244 comprising a poly-crystalline silicon film, and an N type MOS transistor 247 using an impurity diffusion layer 246, which keeps contact with the lower electrode 242, as one of the source and the drain thereof. Incidentally, since the memory cell array region shown in FIG. 2 shows the section at the portion of the impurity diffusion layer 246, the gate electrode of the MOS transistor 247 constituting the memory cell 241 is not shown in the drawing.

Each N type MOS transistor 203 includes a gate electrode 210 about 100 to about 300 nm thick comprising a phosphorus-doped poly-silicon film formed on the P well 201 through a gate oxide film 232, and a pair of N type impurity diffusion layers 220 (only one of them being shown in FIG. 2) formed inside the surface of the P wells 201 on both sides of the gate electrode 210 and serving as the source and the drain. Though only one of the pair of the N type impurity diffusion layers 220 is shown in FIG. 2 for ease of explanation, the other of the N type impurity diffusion layer 220 does not appear in the peripheral circuit region in FIG. 2 because the drawing is a sectional view taken along the gate electrode 210. This also holds true of the later-appearing P type impurity diffusion layer.

The N type MOS transistors 203 and 247 are electrically isolated by a field-shield isolation structure having a shield gate electrode 205 having a pattern crossing orthogonally the gate electrode 210 and a film thickness of about 300 to about 500 nm. The shield gate electrode 205 whose periphery is covered with a silicon dioxide film 233 comprising a sidewall oxide film and a cap oxide film has the potential thereof kept at the ground potential Vee. Since the formation of a parasitic channel in the P well 201 immediately below the shield gate electrode 205 can be thus prevented, the adjacent N type MOS transistors 203 and 247 can be electrically isolated from one another.

Each P type MOS transistor 204 includes an about 100 to 300 nm-thick gate electrode 211 comprising a phosphorus-doped poly-silicon film formed on the N well 202 through a gate oxide film 232, and a pair of P type impurity diffusion layers 222 (only one of them being shown in FIG. 2) formed at the surface portions of the N wells 202 on both sides of the gate-electrode 211 and serving as the source and the drain.

The P type MOS transistors 204 are electrically isolated by a field-shield isolation structure having a shield gate electrode 206 about 300 to about 500 nm thick having a pattern crossing orthogonally the gate electrode 211. The shield gate electrode 206 whose periphery is covered with a silicon dioxide film 233 comprising a sidewall oxide film and a cap oxide film has the potential thereof kept at the power source voltage Vcc. Since the formation of a parasitic channel in the N well 202 immediately below the shield gate electrode 206 can be thus prevented, the adjacent P type MOS transistors 204 can be electrically isolated from one another.

As described above, in the DRAM according to this embodiment, a plurality of the N type MOS transistors 203 and 247 formed in the P well 201 and a plurality of P type MOS transistors 204 formed in the N well 202 are electrically isolated from one another by the field-shield isolation structure which does not generate the bird's beaks inherent to the LOCOS method. Therefore, the active region of each well 201, 202 can be secured more greatly than when isolation is attained by the LOCOS method, and the MOS transistors 203 and 204 can be formed in a higher density. In other words, the DRAM having the CMOS structure can be integrated in a higher density. Because ion implantation into the isolation region in order to form the channel stropper as has been necessary in the LOCOS method is not required, the narrow channel effect of the MOS transistors 203, 204 and 247 can be reduced, the concentration of each well 201, 202 can be lowered and the junction capacitance can be made small. In consequence, the MOS transistors 203, 204 and 247 can be operated at a higher speed, and these transistors can be operated even when the capacitance of the capacitor 241 is small.

In the DRAM according to this embodiment, the field oxide film 214 having a film thickness of about 150 to about 500 nm is formed in such a manner as to bridge the P well 201 and the n well 202, that is, in such a manner as to cross over the PN junction. This field oxide film has an inner surface located inside or within the substrate 200. Since the field oxide film 214 having a film thickness sufficient to prevent the formation of an inversion layer immediately therebelow is formed in this way, the P well 201 and the N well 202 are electrically isolated from each other. Further, the PN junction terminates at the inner surface of the field oxide film 214. In other words, since the field oxide film 214 is formed to a sufficient film thickness, it becomes possible to prevent the formation of a channel below the field oxide film 214 and the operation of the parasitic transistor even when the potential of the wiring conductor formed on this field oxide film 214 (e.g. gate electrodes 210 and 211) changes. Therefore, even when a P type impurity diffusion layer having a relatively high concentration, which has been necessary in the past, is not formed, the P well 201 and the N well 202 can be electrically isolated and the width necessary for isolation can be reduced by far greatly than the prior art. In other words, the DRAM having the CMOS structure can be integrated in a higher integration density.

In the DRAM according to this embodiment, further, the active region to which the voltage is applied in order to keep the well potential is not formed in both P well 201 and N well 202 that form the PN junction adjacent to one another. For this reason, the CMOS circuit can be constituted by directly connecting the gate electrode 210 of the N type MOS transistor 203 and the gate electrode 211 of the P type MOS transistor 204 by a wiring conductor extending on the field oxide film 214 (that is, by forming integrally the two gate electrodes 210 and 211), and the troublesome process step of indirectly connecting the two gate electrodes 210 and 211 through a leading-out electrode, etc, becomes unnecessary. Since the number of portions of multi-layered wiring decreases, reliability of wiring connection can be improved. Incidentally, power source means not shown in FIG. 2 supplies the ground potential Vee and the power source potential Vcc.

As described above, the DRAM according to this embodiment uses the field-shield isolation structure for electrically isolating a plurality of MOS transistors 203, 204 and 247 formed in the P and N wells 201 and 202 from one another, respectively, and uses the field oxide film 214 for electrically isolating the two wells 201 and 202 from each other. According to this arrangement, the area most necessary for isolation in each of the wells 201 and 202 and the well boundary region can be reduced. In consequence, the MOS transistors 203, 204 and 247 can be formed in a higher density, and the DRAM can be integrated in a higher integration density.

Next, a flash EEPROM (flash memory) according to the third embodiment of the present invention will be explained with reference to FIG. 3 which is a schematic sectional view of the EEPROM. This embodiment represents the application of the present invention to a flash memory having a CMOS circuit in a peripheral circuit region.

Figure 3:
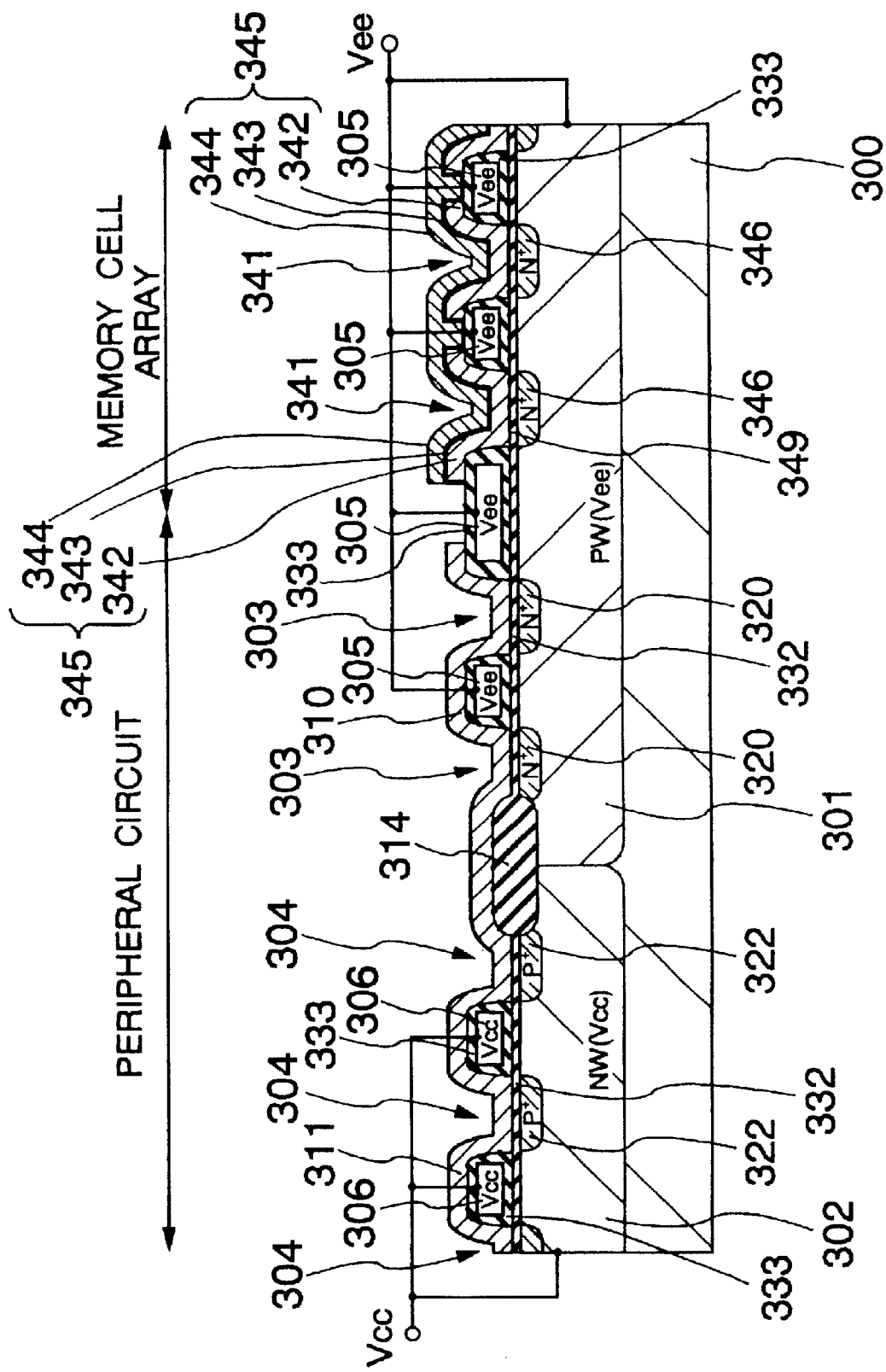
FIG. 3 is a sectional view of a typical flash memory according to a third embodiment of the present invention.

Referring to FIG. 3, a P well (PW) 301 kept at a common potential or a ground potential Vee and an N well (NW) 302 kept at a power source potential Vcc are shown formed inside a silicon substrate 300 having a main surface. P type MOS transistors 304 constituting a peripheral circuit are formed in the N well 302 and N type MOS transistors 303 constituting the peripheral circuit and stacked gate type memory cells 341 constituting a memory cell array are formed in the P well 301.

The memory cell 341 is an N type MOS transistor which includes a composite gate structure 345 comprising a floating gate 342 comprising a poly-silicon film formed on the P well 301 through a tunnel oxide film 349, a dielectric film 343 comprising an ONO film which covers the floating gate 342 and a control gate 344 comprising a poly-silicon film, and uses a pair of N type impurity diffusion layers 346 (only one of them being shown in FIG. 3) formed inside the surface portion of the P wells 301 on both sides of the floating gate as its source and drain. Incidentally, the reason why only one of the pair of N type impurity diffusion layers 346 is shown in FIG. 3 is because the drawing is a sectional view taken along the composite gate structure 345 and the N type impurity diffusion layer does not practically appear in FIG. 3. This also holds true of the later-appearing N type impurity diffusion layer 320 and the P type impurity diffusion layer 322.

The N type MOS transistor 303 includes a gate electrode 310 comprising a phosphorus-doped poly-silicon film formed on the P well 301 through a gate oxide film 332 and having a film thickness of about 100 to about 300 nm and a pair of N type impurity diffusion layers 320 (only one of them being shown in FIG. 3) formed inside the surface of the P wells 301 on both sides of the gate electrode 310.

The N type MOS transistor 303 and the memory cell 341 are electrically isolated by a field-shield isolation structure having a shield gate electrode 305 having a pattern orthogonally crossing the gate electrode 310 and having a film thickness of about 300 to about 500 nm. The shield gate electrode 305 whose periphery is covered with a silicon dioxide film 333 comprising a sidewall oxide film and a cap oxide film has the potential thereof kept at the ground potential Vee. It is therefore possible to prevent the formation of a parasitic channel in the P well 301 immediately below the shield gate electrode 305 and hence, to electrically isolate the adjacent N type MOS transistors 303 and the adjacent memory cells 341 from one another.

The P type MOS transistor 304 has a gate electrode 311 comprising a phosphorus-doped poly-silicon film formed on the N well 302 through the gate oxide film 332 and having a film thickness of about 100 to about 300 nm and a pair of P type impurity diffusion layers 322 (only one of them being shown in FIG. 3) formed at the surface portion of the N wells 302 on both sides of the gate electrode 311.

The P type MOS transistors 304 are isolated by the field-shield isolation structure having a shield gate electrode 306 having a pattern orthogonally crossing the gate electrode 311 and having a film thickness of about 300 to about 500 nm. The shield gate electrode 306 whose periphery is covered with a silicon dioxide film 333 comprising a sidewall oxide film and a cap oxide film has the potential thereof kept at the power source potential Vcc. Since the formation of the parasitic channel in the N well 302 immediately below the shield gate electrode 306 can be prevented by this structure, the adjacent P type MOS transistors 304 can be electrically isolated from one another.

In the flash memory according to this embodiment, a plurality of N type MOS transistors 303 and the memory cells 341 formed in the P well 301 and a plurality of P type MOS transistors 304 formed in the N well 302 are electrically isolated from one another by the field-shield isolation structure which does not invite the occurrence of the bird's beaks inherent to the LOCOS method. Therefore, the active region of each well 301, 302 can be made greater than when isolation is attained by the LOCOS method, and the MOS transistors 303 and 304 and the memory cells 341 can be formed in a higher density. In other words, the flash memory having the CMOS structure can be constituted in a higher integration density. Because ion implantation into isolation region for forming the channel stopper, which has been necessary according to the LOCOS method, is not necessary, the narrow channel effect of the MOS transistors 303 and 304 and the memory cell 341 can be reduced, the concentration of each well 301, 302 can be lowered. In consequence, the junction capacity becomes small, and the MOS transistors 303 and 304 and the memory cell 341 can be operated at a higher operation speed.

In the flash memory according to this embodiment, the memory cells 341 are electrically isolated from one another by the field-shield isolation structure. For this reason, the parasitic transistor does not develop even when a high voltage is applied to the control gate 344. In other words, rewrite of the memory cell 341 can be executed with high efficiency by applying a high voltage to the control gate 344.

In the flash memory according to this embodiment, the field oxide film 314 having a film thickness of about 150 to about 500 nm is formed in such a manner as to bridge the P well 301 and the N well 302, that is, in such a manner as to cross over the PN junction therebetween. This field oxide film has an inner surface located inside or within the substrate 300. Because the field oxide film 314 having a film thickness sufficient to prevent the formation of an inversion layer immediately therebelow is formed in this way, the P well 301 and the N well 302 are electrically isolated from each other. Further, the PN junction terminates at the inner surface of the field oxide film 314. In other words, because the field oxide film 314 is formed to a sufficient film thickness, it is possible to prevent the formation of the channel below the field oxide film 314 and the operation of the resulting parasitic transistor even when the potential of a wiring conductor formed on this field oxide film 314 (for example, the gate electrodes 310 and 311) changes. In consequence, the P well 301 and the N well 302 can be electrically isolated without forming the P type impurity diffusion layer having a relatively high impurity concentration, which has been necessary in the past, and the width necessary for isolation can be reduced by far more greatly than in the prior art. Accordingly, the flash memory having the CMOS structure can be integrated in a higher integration density.

In the flash memory according to this embodiment, the active region to which a voltage for keeping the well potential is not formed in both of the P and N wells 301 and 302 adjacent to each other and constituting the PN junction. Therefore, the CMOS circuit can be constituted by directly connecting the gate electrode 310 of the N type MOS transistor 303 and the gate electrode 311 of the P type MOS transistor 304 by a conductor extending on the field oxide film 314 (that is, by integrally forming the two gate electrodes 310 and 311). Therefore, the troublesome step of indirectly connecting the two gate electrodes 310 and 311 by a leading-out electrode can be eliminated. Further, because the number of portions as multi-layered wiring decreases, reliability of wiring connection can be improved. Incidentally, power source means not shown in FIG. 3 supplies the ground potential Vee and the power source potential Vcc.

As explained above, the flash memory according to this embodiment uses the field-shield isolation structure for electrically isolating a plurality of MOS transistors 303 and 304 formed in the P and N wells 301 and 302 and the memory cells 341, and uses the field oxide film 314 for electrically isolating the two wells 301 and 302 from each other. Therefore, the area most necessary for isolation can be reduced in the wells 301 and 302 and the well boundary. In other words, since the MOS transistors 303 and 304 and the memory cells 341 can be formed in a higher density, the flash memory can be integrated in a higher integration density.

Next, a flash EEPROM (flash memory) according to the fourth embodiment of the present invention will be explained with reference to FIG. 4 which is schematic sectional view of the flash memory. This embodiment represents the application of the present invention to a flash memory having a CMOS circuit in a peripheral circuit region and in a negative voltage control circuit region.

In this embodiment, the negative voltage control circuit selectively applies a negative voltage to the control gate or the source/drain of the memory cell transistor of the flash memory at the time of writing of data. By this negative voltage control circuit, the withstand voltage of the tunnel oxide film, etc, can be increased and reliability of the memory cell can be improved. In order to apply the negative voltage to the control gate or the source/drain of the memory cell transistor, a P well 452 having a negative potential must be formed, and to electrically isolate this P well 452 having the negative potential from the substrate 400, an N well 351 encompassing the P well 452 having the negative potential and kept at the ground potential Vee, for example, must be formed. Therefore, the flash memory according to this embodiment includes a negative voltage control circuit whose P well 452 is encompassed by the N well 451 in addition to the peripheral circuit and the memory cell array that have been explained with reference to FIG. 3. In other words, this flash memory constitutes a so-called "triple well structure" with the later-appearing P well 401.

Figure 4:
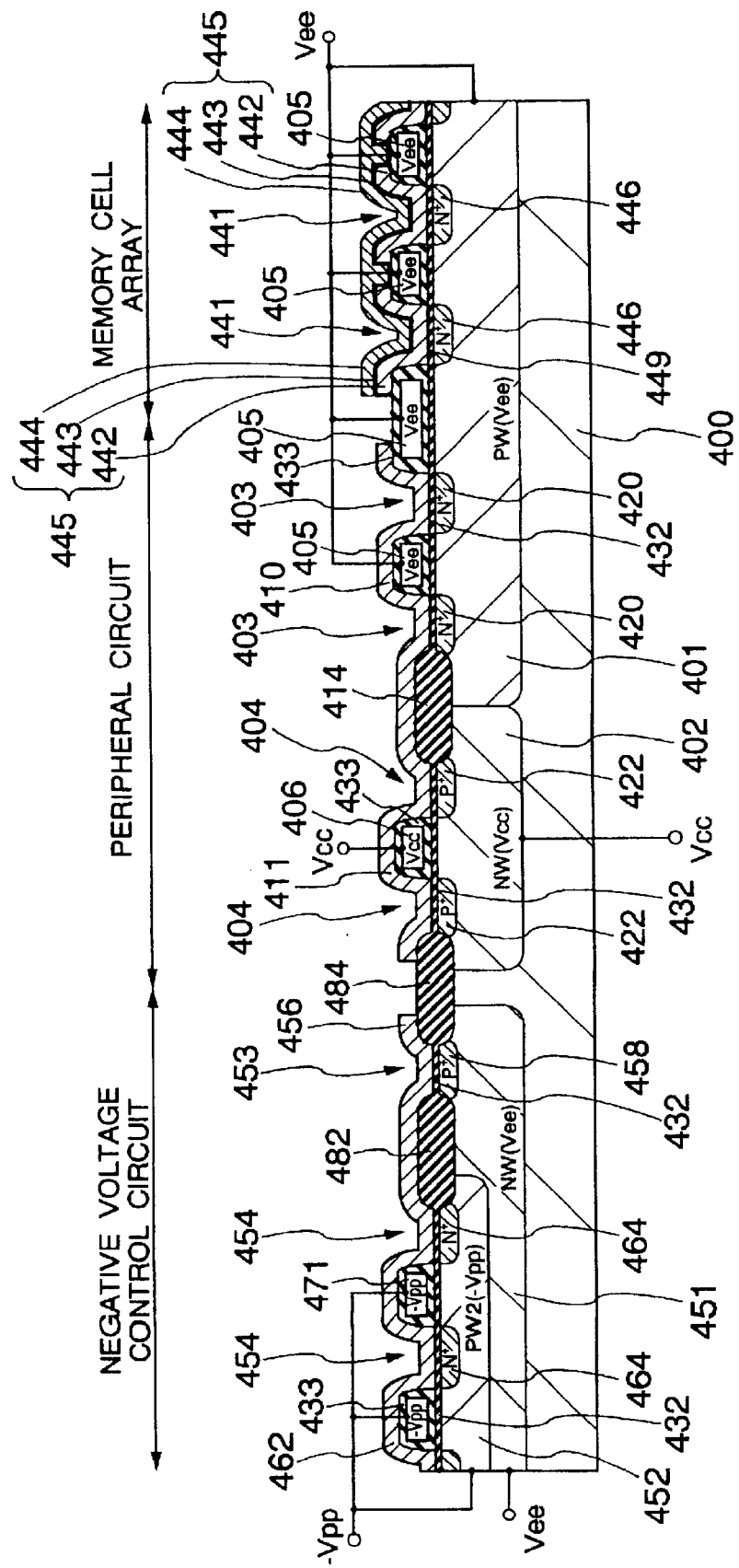
FIG. 4 is a sectional view of another typical flash memory according to a fourth embodiment of the present invention.

In FIG. 4, a P well (PW) 401 kept at a common potential or a ground potential Vee, an N well (NW) 402 kept at a power source potential Vcc and an N well (NW) 451 kept at the ground potential Vee are formed inside a silicon substrate 400 having a main surface, and a P well (PW) 452 kept at a negative potential −Vpp is formed inside the N well 451. A P type MOS transistor 404 that constitutes a peripheral circuit is formed in the N well 402. An N type MOS transistor 403 constituting the peripheral circuit is formed in the P well 401, and a stacked gate type memory cell 441 of a flash memory, that constitutes the memory cell array, is formed, too.

The memory cell 441 has a composite gate structure 445 including a floating gate 442 comprising a poly-silicon film formed on the P well 401 through a tunnel oxide film 449, a dielectric film 443 comprising an ONO film that covers the floating gate 442, and a control gate 444 comprising a poly-silicon film, and is an N type MOS transistor using a pair of N type impurity diffusion layers 446 (only one of them being shown in FIG. 4) formed inside the surface of the P wells 401 on both sides of the floating gate 442 as the source and the drain thereof. Incidentally, one of the pair of the N type impurity diffusion layers 446 is shown for ease of explanation but because FIG. 4 is a sectional view taken along the composite gate structure 445, the other N type impurity diffusion layer 446 does not appear in FIG. 4. This also holds true of the latter-appearing impurity diffusion layers 420 and 464 and P type impurity diffusion layers 422 and 458.

The N type MOS transistor 403 includes a gate electrode 410 comprising a phosphorus doped poly-silicon film formed on the P well 401 through a gate oxide film 432 and having a film thickness of about 100 to about 300 nm and a pair of N type impurity diffusion layers 420 (only one of them being shown in FIG. 4) formed inside the surface of the P well 401 on both sides of the gate electrode 410 and serving as the source/drain thereof.

The N type MOS transistor 403 and the memory cell 441 are electrically isolated by the field-shield isolation structure having a shield gate electrode 405 having a pattern orthogonally crossing the gate electrode 410 and having a film thickness of about 300 to about 500 nm. The shield gate electrode 405 whose periphery is covered with a silicon dioxide film 433 comprising a sidewall oxide film and a cap oxide film has the potential thereof kept at the ground potential Vee. Since the formation of the parasitic channel in the P well 401 immediately below the shield gate electrode 405 is prevented by this structure, the adjacent N type MOS transistors 403 and the adjacent memory cells 441 can be electrically isolated from one another.

The P type MOS transistor 404 includes a gate electrode 411 comprising a phosphorus-doped poly-silicon film formed on the N well 402 through a gate oxide film 432 and having a film thickness of about 100 to about 300 nm, and a pair of P type impurity diffusion layers 422 (only one of them being shown in FIG. 4) formed inside the surface of the N wells 402 on both sides of the gate electrode 411 and serving as the source and the drain of the transistor.

The P type MOS transistors 404 are isolated by a field-shield isolation structure having a shield gate electrode 406 having a pattern orthogonally crossing the gate electrode 411 and a film thickness of about 300 to about 500 nm. The shield gate electrode 406 whose periphery is covered with a silicon dioxide film 433 comprising a sidewall film and a cap oxide film has the potential thereof kept at a power source potential Vcc. Since the formation of a parasitic channel in the N well 402 immediately below the shield gate 406 can be thus prevented, the adjacent P type MOS transistors 404 can be electrically isolated from one another.

In the flash memory according to this embodiment described above, a plurality of n type MOS transistors 403 and the memory cells 441 formed in the P well 401 and a plurality of P type MOS transistors 404 formed in the N well 402 are electrically isolated from one another by the field-shield isolation structure devoid of the occurrence of the bird's beaks inherent to the LOCOS method. Therefore, the active region of each well 401 and 402 can be made greater than when isolation is attained by the LOCOS method, and the MOS transistors 403 and 404 as well as the memory cells 441 can be formed in a higher density. In other words, the flash memory having the CMOS structure can be highly integrated. Since the flash memory of this embodiment does not require ion implantation into the isolation region for forming the channel stopper which has been necessary in the LOCOS method, the narrow channel effect of the MOS transistors 403 and 404 and the memory cells 441 can be reduced, and the concentration of each well 401 and 402 can be lowered, thereby reducing the junction capacity. As a result, the MOS transistors 403 and 404 and the memory cells 441 can be operated at a higher operation speed.

Further, in the flash memory according to this embodiment, the memory cells 441 are electrically isolated from one another by the field-shield isolation structure. Therefore, even when a high voltage is applied to the control gate 444, there is no possibility of the occurrence of the parasitic transistor and consequently, the memory cell 441 can be rewritten highly efficiently by applying a high voltage to the control gate 444.

In the flash memory according to this embodiment, the field oxide film 414 having a film thickness of about 150 to about 500 nm is formed in such a manner as to bride the P well 401 and the N well 402 or in other words, in such a manner as to cross over the PN junction therebetween. This field oxide film has an inner surface located inside or within the substrate 400. Because the field oxide film 414 having a thickness sufficient to prevent the formation of an inversion layer immediately therebelow is formed, the P well 401 and the N well 402 are electrically isolated from each other. The PN junction terminates at the inner surface of the field oxide film 414. In other words, because the field oxide film 414 is formed to a sufficient thickness, it is possible to prevent the formation of a channel immediately below the field oxide film 414 and the operation of the resulting parasitic transistor even when a potential of a wiring formed on this field oxide film 414 (for example, the gate electrodes 410 and 411) changes. Accordingly, the P well 401 and the N well 402 can be electrically isolated from each other without forming the P type impurity diffusion layer having a relatively high concentration in the P well as has been necessary in the prior art, and the width necessary for isolation can be reduced by far more greatly than in the prior art. In consequence, the flash memory having the CMOS structure can be integrated more highly.

In the flash memory according to this embodiment, the active region to which a voltage is applied so as to keep a well potential are not formed in both the P and N wells 401 and 402 adjacently constituting the PN junction and for this reason, the CMOS circuit can be constituted by directly connecting the gate electrode 410 of the N type MOS transistor 403 and the gate electrode 411 of the P type MOS transistor by a conductor extending on the field oxide film 414 (in other words, by integrally forming the two grate electrodes 410 and 411). Therefore, the troublesome process step of indirectly connecting these gate electrodes 410 and 411 by a leading-out electrode, etc, becomes unnecessary. Further, since the number of portions of multi-layered wiring decreases, reliability of wiring connection can be improved.

On the other hand, a P type MOS transistor 453 is formed in the N well 451 constituting the negative voltage control circuit, and an N type MOS transistor 454 is formed in the P well 452.

The P type MOS transistor 453 includes a gate electrode 456 comprising a phosphorus-doped poly-silicon film formed on the N well 451 through a gate oxide film 432 and having a film thickness of about 100 to about 300 nm and a pair of P type impurity diffusion layers 458 (only one of them being shown in FIG. 4) formed inside the surface of the N wells 451 on both sides of the gate electrode 456 and serving as the source and the drain of the transistor.

The N type MOS transistor 454 includes a gate electrode 462 comprising a phosphorus-doped poly-silicon film formed on the P well 452 through a gate oxide film 432 and having a film thickness of about 100 to about 300 nm and a pair of N type impurity diffusion layers 464 (only one of them being shown in FIG. 4) formed inside the surface of the P wells 452 on both sides of the gate electrode 462 and serving as the source and the drain of the transistor.

The N type MOS transistors 454 are isolated by a field-shield isolation structure having a shield gate electrode 471 having a pattern orthogonally crossing the gate electrode 462 and having a film thickness of about 300 to about 500 nm. The shield gate electrode 471 whose periphery is covered with a silicon dioxide film 433 comprising a sidewall oxide film and a cap oxide film has the potential thereof kept at the negative potential −Vpp. Since the formation of a parasitic channel in the P well 452 immediately below the shield gate electrode 471 can be thus prevented, the adjacent N type MOS transistors 454 can be electrically isolated from one another.

As described above, in the flash memory according to this embodiment, a plurality of N type MOS transistors 454 formed in the P well 452 constituting the negative voltage control circuit are electrically isolated from one another by the field-shield isolation structure devoid of the occurrence of the bird's beaks inherent to the LOCOS method. Therefore, the active region of the P well 452 can be formed into a greater area than when isolation is attained by the LOCOS method, and the MOS transistors 454 can be fabricated in a higher density.

Further, in the flash memory according to this embodiment, the field oxide film 482 having a film thickness of about 150 to about 500 nm is formed in such a manner as to bridge the P well 452 and the N well 451 that constitute the negative voltage control circuit, or to cross over the PN junction therebetween. This field oxide film 482 has an inner surface located inside the substrate 400 in the same way as the field oxide film 414 described above. Because the field oxide film 482 having a film thickness sufficient to prevent the formation of an inversion layer immediately therebelow is formed in this way, the P well 452 and the N well 451 are electrically isolated from each other. The PN junction terminates at the inner surface of the field oxide film 482. In other words, because the field oxide film 482 is formed to a sufficient film thickness, the formation of the channel below the field oxide film 482 and the operation of the resulting parasitic transistor can be prevented even when the potential of a wiring conductor formed on the field oxide film 482 (for example, the gate electrodes 456 and 462) changes. For this reason, the P well 452 and the N well 451 can be electrically isolated from each other without forming a P type impurity diffusion layer having a relatively high concentration in the p well which has been necessary in the prior art, and the width necessary for isolation can be reduced by far more greatly than in the prior art. In other words, the flash memory having the CMOS structure can be integrated in a high integration density. Incidentally, this embodiment uses the field oxide film 484 in order also to electrically isolate the N well 402 kept at the power source potential Vcc from the N well 451 kept at the ground potential Vee. Therefore, the width necessary for isolating them can be reduced. Incidentally, the thickness of the field oxide film 484 and the correlation between the two PN junctions formed between the wells 402 and 451 and the substrate 400 and the inner surface of the field oxide 484 are the same as those which have been explained already about the field oxide films 414 and 482.

In the flash memory according to this embodiment, the active region to which a voltage is applied for keeping the well potential is not formed in the P well 452. Therefore, the CMOS circuit can be constituted by directly connecting the gate electrode 462 of the N type MOS transistor 454 and the gate electrode 456 of the P type MOS transistor 453 by a conductor extending on the field oxide film 482 (that is, by integrally forming the two gate electrodes 462 and 456). In consequence, the troublesome process step can be eliminated and because the number of portions of multi-layered wiring decreases, reliability of wiring connection can be improved. Incidentally, power source means not shown in FIG. 4 supplies the ground potential Vee, the power source potential Vcc and the negative potential −Vpp.

As described above, the flash memory according to this embodiment uses the field-shield isolation structure for electrically isolating a plurality of MOS transistors 403, 404 and 454 and a plurality of memory cells 441 formed in the P wells 401 and 452 and in the N wells 402 from one another, and uses the field oxide films 414 and 482 for isolating the two wells 401 and 402 and the wells 451 and 452 from one another. Therefore, the area most necessary for isolation can be reduced in the wells 401, 402, 451 and 452 and in the well boundary region, and the MOS transistors 403, 404, 453 and 454 and the memory cells 441 can be fabricated in a higher density, so that the integration density of the flash memory can be further increased.

In the semiconductor devices according to the first to fourth embodiments of the invention described above, a plurality of well regions are formed inside the semiconductor substrate, electrical isolation between the well regions and between the well regions and the boundary with the semiconductor substrate is attained by the field oxide films, respectively, and isolation of the elements in each well is attained by the field-shield isolation structure. By such structures, mutual isolation of the well regions and isolation between the well regions and the boundary with the semiconductor substrate can be attained by a small size, and isolation between the well region and another or the substrate can be attained by a small size, too. Further, the elements in each well can be isolated by a small size. In other words, because optimum isolation is made for each position, the semiconductor device can be integrated in a higher integration density.

Hereinafter, the fifth embodiment of the present invention will be explained with reference to FIG. 5.

Figure 5:
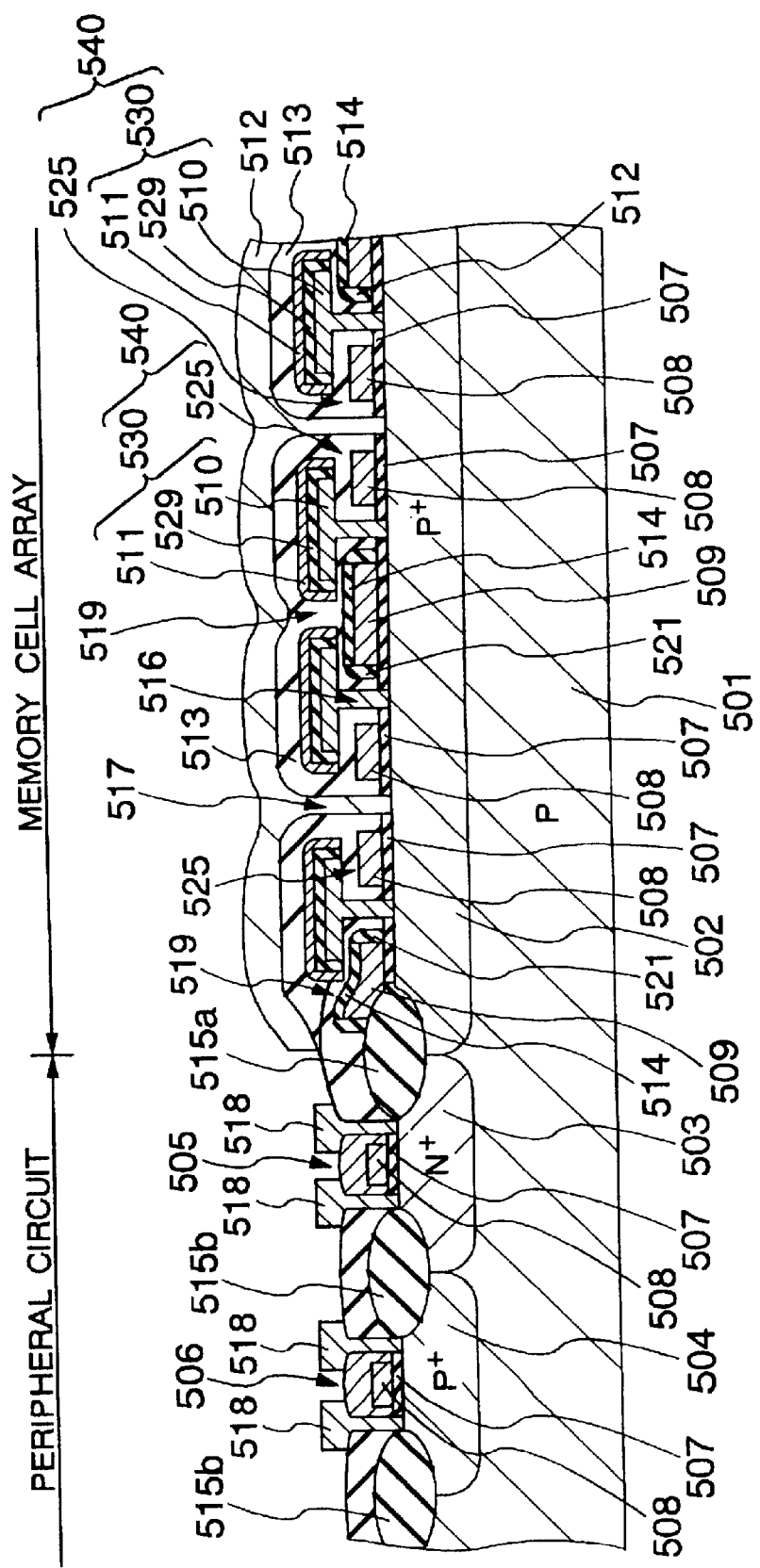
FIG. 5 is a sectional view of another typical DRAM according to a fifth embodiment of the present invention.

FIG. 5 is a sectional view of a DRAM according to this embodiment. In the DRAM of this embodiment, elements are isolated by the field-shield method in a memory cell array section and by the LOCOS method in a peripheral circuit section.

The peripheral circuit section includes a CMOS circuit constituted by N type MOS transistors 506 formed by using a p$^+$ layer (P well) 504 formed inside a silicon substrate 501 having a main surface and P type MOS transistors 505 formed by using an n$^+$ layer (N well) 503 formed inside the substrate 501. A source/drain connection conductor 518 is connected to the source/drain of each transistor (not shown). Each of the transistors 506 and 505 has a gate electrode 508 formed on the gate oxide film 507.

In the peripheral circuit section in which a large number of such CMOS circuits exist, SiO$_2$ films (field oxide films) 515a and 515b having a film thickness of at least about 150 nm and for example, 500 nm, are formed by thermally oxidizing the surface of the silicon substrate 501 by the LOCOS method. The transistors 505 and 506 formed in the peripheral circuit section, that is, the two wells 503 and 504, are electrically isolated from each other by this $SiO_2$ film 515b. Each of the field oxide films 515a and 515b has an inner surface located inside the substrate 501, and the PN junction between the wells 502 and 503 and the PN junction between the wells 503 and 504 terminate at the inner surface of the field oxide films 515a and 515b, respectively. By this structure, the wells 502 and 503 and the wells 503 and 504 are electrically isolated from each other, respectively.

The memory cell array section includes a large number of DRAM memory cells 540 each comprising one MOS transistor 525 and one capacitor 530 formed in the $p^+$ layer (P well) 502 formed inside the silicon substrate 501.

Each MOS transistor 525 has a $SiO_2$ film 507 serving as a gate oxide film and a gate electrode 508 made of poly-silicon and formed on the $SiO_2$ film 507.

Each capacitor 530 comprises a cell node (lower electrode) 510 connected to one of the source/drain regions (not shown) of the MOS transistor 525 at a cell node contact 516, a cell plate (upper electrode) 511 opposing this cell node 510 and a dielectric film 529 sandwiched between the cell node 510 an the cell plate 511. The other source/drain region (not shown) is connected to a metal wiring 512 at a bit contact 517.

In the memory cell section in which a large number of such DRAM memory cell exist, a field-shield isolation structure is constituted by the $SiO_2$ film 507, the poly-silicon film (shield gate electrode) 509, the $SiO_2$ film 514 and the sidewall $SiO_2$ film 521. The sidewall $SiO_2$ film 521 isolates the poly-silicon film 509 from other wirings. The potential of the poly-silicon film (shield gate electrode) 509 is kept at 0 V or a ½ power source voltage. Incidentally, in order to isolate the P channel MOS transistors, the potential of the poly-silicon film 509 is preferably kept at the power source voltage or the ½ power source voltage. A plurality of MOS transistors 525 formed in the memory cell region are electrically isolated by this field-shield isolation structure 519.

According to this embodiment, isolation is attained by the field-shield isolation structure 519 in the memory cell array section in which a plurality of N type MOS transistors 525 are formed. Therefore, in comparison with isolation by the LOCOS method, the chip area can be reduced by about 0.5 μm per transistor region. Since the memory cell array section comprises the N type MOS transistors and almost no PN junction exists, a guard ring having a width of about 10 μm need not be formed.

In the peripheral circuit section in which the P and N type MOS transistors 505 and 506 co-exist, on the other hand, isolation is attained by the thick $SiO_2$ film 515 formed by the LOCOS method. Therefore, a guard ring having a width of about 10 μm, which is necessary for isolation by the field-shield isolation structure, need not be formed.

As described above, this embodiment employs the field-shield isolation structure for a relatively broad region in which only the MOS transistors of the same conductivity type exist such as the memory cell array section, for isolation, and employs the field insulating film for a region in which the CMOS circuits are formed such as the peripheral circuit section, for isolation. In other words, this embodiment combines the isolation technology by the field-shield isolation structure and the isolation technology by the $SiO_2$ film (field oxide film) 515 formed by the LOCOS method in such a manner as to appropriately correspond to each region of the DRAM. In this way, this embodiment can drastically reduce the chip area as a whole.

Hereinafter, the sixth embodiment according to the present invention will be explained with reference to FIGS. 6a to 6h.

Though this embodiment is a suitable embodiment for the method of manufacturing a floating gate type non-volatile semiconductor memory device such as an EEPROM, it can be applied to the manufacture of the semiconductor devices explained in the first to fifth embodiments.

In this embodiment, impurity ions are implanted into a peripheral circuit formation section 612 of a P type silicon substrate 611 having a specific resistance of about 10 Ω·cm so as to form a P well 614 and an N well 615, and to form a P well 616 in a memory cell array formation section 613, as shown in FIG. 6a. PN junctions between the wells 614 and 615 and between the wells 615 and 616 terminate at the main surface of the substrate 611.

Next, as shown in FIG. 6b, a silicon dioxide film 617 having a film thickness of about 20 to about 40 nm is formed on the entire surface of the silicon substrate 611 by thermal oxidation. A poly-silicon film 621 having a film thickness of about 100 to about 200 nm is deposited onto the entire surface of the silicon dioxide film 617 by a CVD process, and a silicon nitride film 622 having a film thickness of about 150 nm is further deposited to the entire surface of the poly-silicon film 621 by the CVD process.

Then, the silicon nitride film 622 and the poly-silicon film 621 are removed in a width of about 0.8 μm, for example, from the portion which is to serve as the element isolation region of the peripheral circuit formation section 612 (inclusive of the portions in the vicinity of the boundary between the P well 614 and the N well 615) and from the portion in the vicinity of the boundary between the peripheral circuit formation section 612 and the memory cell array formation section 613 (that is, the boundary between the N well 615 and the P well 616) by photolithography and etching. In this way, the silicon nitride film 622 and the poly-silicon film 621 are left on the entire surface of the region of the peripheral circuit formation section 612 which is to serve as the active region and the memory cell array formation section 613. Incidentally, only the silicon nitride film 622 may be removed without removing the poly-silicon film 621.

Next, as shown in FIG. 6c, a silicon dioxide film 623b as a field oxide film and a silicon dioxide film 623a as a field oxide film are formed at the portion which is to serve as the element isolation region of the peripheral circuit formation section 612 and at the portion of the substrate inclusive of the boundary between the formation portions 612 and 613, respectively, by selectively oxidizing the silicon substrate at a temperature of about 1,000° C. by using the silicon nitride film 622 as the oxidation prevention film having the poly-silicon film 621 formed as the lower layer thereof.

Since the poly-Si buffered LOCOS method is carried out in this embodiment as described above, the growth of the silicon dioxide film 623 in the direction of the surface of the silicon substrate 611 is restricted by the poly-silicon film 621. Therefore, the bird's beaks of the silicon dioxide film occur in a width of only about 0.2 μm (refer to JP-A-56-70644 laid open on Jun. 12, 1981, for example).

The field oxide film 623a covers the junction between the wells 615 and 616, while the field oxide film 623b covers the PN junction between the wells 614 and 615, at the main surface of the substrate 611, respectively. In other words, the PN junctions terminate at the inner surface of the field oxide films 623a and 623b, respectively.

As shown in FIG. 6d, the silicon nitride film 622 is removed by wet etching using phosphoric acid, and a silicon dioxide film 624 having a film thickness of about 100 nm is deposited to the entire surface by the CVD method. The silicon dioxide film 624 and the poly-silicon film 621 are removed from the entire surface of the peripheral circuit formation section 612 and from the region of the memory cell array formation section 613 to serve as the active region by photolithography and etching. As a result, a pattern of the silicon dioxde film 624 and the poly-silicon film 621 as the shield gate electrode is left in a width of about 0.8 µm in only the region which is to serve as the element isolation region of the memory cell array formation section 613. Incidentally, it is possible to leave the silicon nitride film 622 and to use this silicon nitride film 622 as the insulating film on the poly-silicon film 621.

Next, as shown in FIG. 6e, a silicon dioxide film 625 having a film thickness of about 100 nm is deposited to the entire surface by the CVD method, and the entire surface of this silicon dioxide film 625 is then etched back so as to form a sidewall oxide film comprising this silicon dioxide film 625 on the side surfaces of the poly-silicon film 621 and the silicon dioxide film 624. Due to etch-back of the silicon dioxide film 625 at this time, the silicon dioxide film 617 is removed from the active regions of both the peripheral circuit formation section 612 and the memory cell array formation section 613 and the silicon substrate 611 is exposed. Incidentally, the poly-silicon film 621 which is to serve as the shield gate electrode is connected so as to attain the same potential as the P well 616 in the subsequent process step, so that isolation by the field-shield method is accomplished in the memory cell array formation section 613. Incidentally, FIG. 6e shows the silicon dioxide film 623a formed in the vicinity of the boundary between the N well 615 and the P well 616 in such a manner that it keeps contact with the isolation structure using the poly-silicon film 621 as the shield gate electrode, but the silicon dioxide film 623a need not be always formed in this way. In other words, the silicon dioxide film 623a and the isolation structure using the poly-silicon film 621 may be spaced apart from each other.

Next, a silicon dioxide film 626 to serve as a gate oxide film or a tunnel oxide film is formed on the surface of the exposed silicon substrate 611 by thermally oxidizing this surface, as shown in FIG. 6f. Therefore, a floating gate in the memory cell array formation section 613 is formed by using an N type poly-silicon film 627, and a capacitance dielectric film for the floating gate and the control gate is formed by using an ONO film (silicon dioxide film/silicon nitride film/silicon dioxide film). Incidentally, the silicon dioxide film 626 to be formed in the peripheral circuit formation section 612 and the silicon dioxide film 626 to be formed in the memory cell array formation section 613 having mutually different film thickness may be formed by separate process steps.

The gate electrode in the peripheral circuit formation section 612 and the control gate in the memory cell array formation section 613 are then formed by using the N type poly-silicon film 632. In this instance, the gate electrode in the peripheral circuit formation section 612 may be formed by using both of the poly-silicon films 627 and 632, or by using only the poly-silicon film 627.

Next, as shown in FIG. 6g, N type impurity ions are implanted into the P well 614 of the peripheral circuit formation section 612 and into the memory cell array formation section 613 so as to form a pair of N type impurity diffusion layers 633 on both sides of the poly-silicon film 632. Further, P type impurity ions are implanted into the N well 615 of the peripheral circuit formation section 612 to form P type impurity diffusion layers 634 on both sides of the poly-silicon film 632. In this way, the N type MOS transistor 635 and the P type MOS transistor 636 together constituting a CMOS circuit are completed in the peripheral circuit formation section 612 while the memory cell transistor 637 is completed in the memory cell array formation section 613. Thereafter, an inter-level insulating film 641 is formed on the entire surface.

Next, a contact hole 642 is bored in the inter-level insulating film 641 in such a manner as to reach the N type impurity diffusion layer 633 and the P type impurity diffusion layer 634 as shown in FIG. 6h. An aluminum (Al) wiring 643 is then patterned so that it can be connected to the N type impurity diffusion layer 633 and the P type impurity diffusion layer 634 in the contact hole 642. Furthermore, a surface protective film (not shown), etc, is formed, and a non-volatile semiconductor memory device having the CMOS circuit in the peripheral circuit section 612 and the floating gate memory cell transistors 637 in the memory cell array formation section 613 can be completed.

As described above, since this embodiment uses the poly-silicon film 621, which is formed as the buffer layer when the poly-Si buffered LOCOS method is carried out, as the shield gate electrode in the memory cell array formation section 613, it does not require to afresh form a conductor film such as a new poly-silicon film so as to form the shield gate electrode, and can therefore reduce the number of the process steps.

Though this embodiment represents the application of the present invention to the manufacture of the non-volatile semiconductor memory device having the floating gate type memory cell transistors, the present invention can be likewise applied to the manufacture of non-volatile semiconductor memory devices having memory cell transistors of types other than the floating gate type and semiconductor devices other than the non-volatile semiconductor memory device such as DRAMS.

Next, the seventh embodiment of the present invention will be explained with reference to FIGS. 7a to 7g. This embodiment represents a preferred embodiment of the invention relating to the method of manufacturing a one-transistor one-capacitor type DRAM, but it can be similarly applied to the manufacture of the semiconductor devices explained with reference to the first to fifth embodiments.

The DRAM to be manufactured by this embodiment uses two kinds of internal power sources in order to restrict the increase of a field intensity resulting from miniaturization of elements. In other words, a relatively higher voltage is applied to the gate electrode of each MOS transistor constituting the peripheral circuit section while a relatively lower voltage is applied to the gate electrode of each MOS transistor constituting the memory cell array section. Therefore, the gate oxide film of each MOS transistor must have a film thickness suitable for each impression voltage. For instance, the film thickness is preferably about 30 nm for the impressed voltage of 20 V and about 11 nm for the impressed voltage of 3.3 V.

Therefore, the manufacturing method of this embodiment isolates the peripheral circuit section and the memory cell array section from each other by the LOCOS method and the field-shield method in the same way as in the first to fifth embodiments, and manufactures the DRAM, which forms the gate oxide films of both sections to the most suitable film thickness for the respective active elements, by a minimum necessary number of process steps while preventing defects such as short-circuit.

Figure 7A:
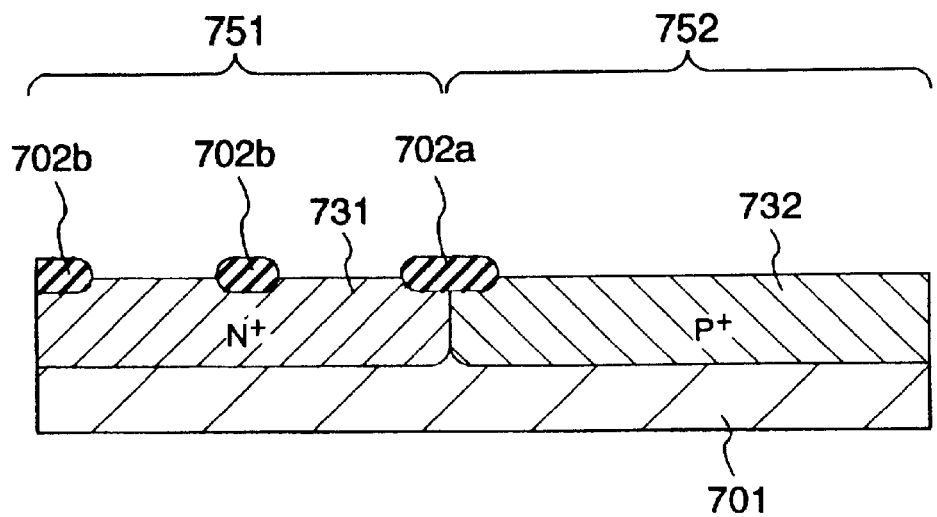
FIGS. 7a to 7g are sectional views showing step-wise a method of manufacturing a semiconductor device according to a seventh embodiment of the present invention.

The DRAM according to this embodiment is manufactured in the following way. First, as shown in FIG. 7a, an N type impurity such as phosphorus (P) is implanted into the peripheral circuit formation section 751 of the P type silicon substrate 701 so as to form the N well 731, and a P type impurity such as boron (B) is implanted into the memory array formation section 752 so as to form the P well 732. The PN junction between these wells 731 and 732 terminates at the main surface of the substrate 701.

Next, a silicon nitride film (not shown) is patterned and formed in the isolation region of the peripheral circuit formation section 751 and the portion inclusive of the boundary between the N well 731 and the P well 732 and then selective thermal oxidation is carried out by using this silicon nitride film as the oxidation-resistant mask so as to form field oxide films 702b and 702a having a film thickness of about 500 to about 800 nm in the isolation region of the peripheral circuit formation section 751 and in the portion of the substrate 701 inclusive of the boundary between the wells 731 and 732, respectively. The silicon nitride film is thereafter removed by wet etching by using phosphoric acid. The field oxide film 702a covers the PN junction between the wells 731 and 732 at the main surface of the substrate 701. In other words, the PN junction terminates at the inner surface of the field oxide film 702a.

Figure 7B:
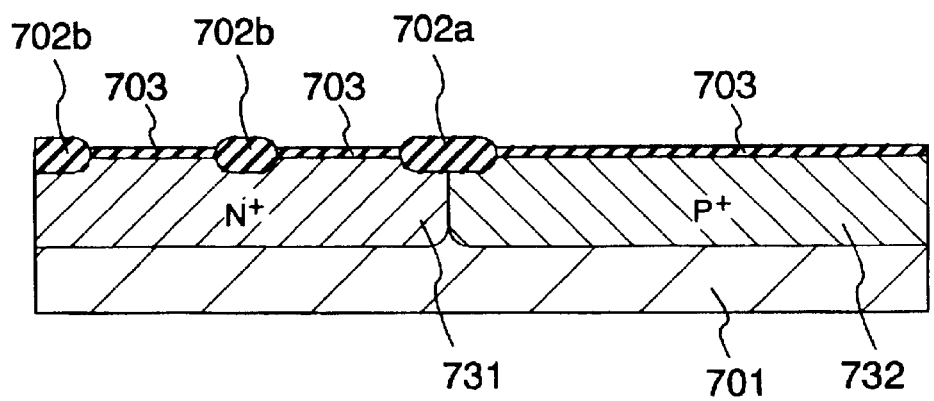

Next, a gate oxide film 703 having a film thickness of about 20 to about 30 nm is formed on the surface of each of the N well 731 and the P well 732, on which the field oxide film 702a and 702b is not formed, by thermal oxidation as shown in FIG. 7b.

Figure 7C:
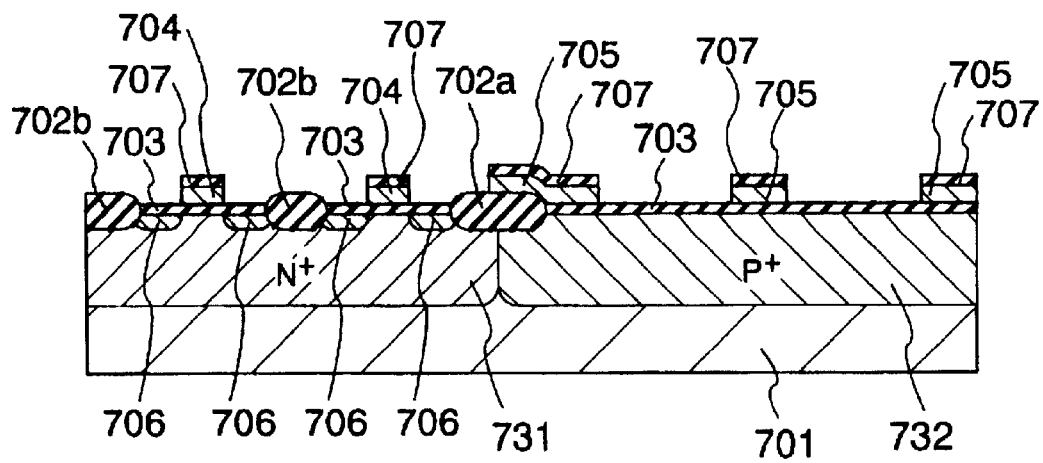

An N type poly-silicon film (704, 705) having a film thickness of about 200 to about 400 nm and a silicon dioxide film 707 having a film thickness of about 100 to about 150 nm are deposited to the entire surface by the CVD method as shown in FIG. 7c. These silicon dioxide film 707 and poly-silicon film are then processed in the peripheral circuit formation section 751 into the pattern of the gate electrode 704 of the MOS transistors and into the pattern of the shield gate electrode 705, in the memory cell array formation section 752. Next, a P type impurity ion is implanted into the N well 731 by using, as the mask, the photoresist (not shown) formed into a pattern covering the memory cell array section 752, the field oxide films 702a and 702b and the gate electrode 704. In consequence, a P type impurity diffusion layer having a low concentration (LDD layer) 706 is formed in the surface of the N wells 731 on both sides of the gate electrode 704.

Figure 7D:
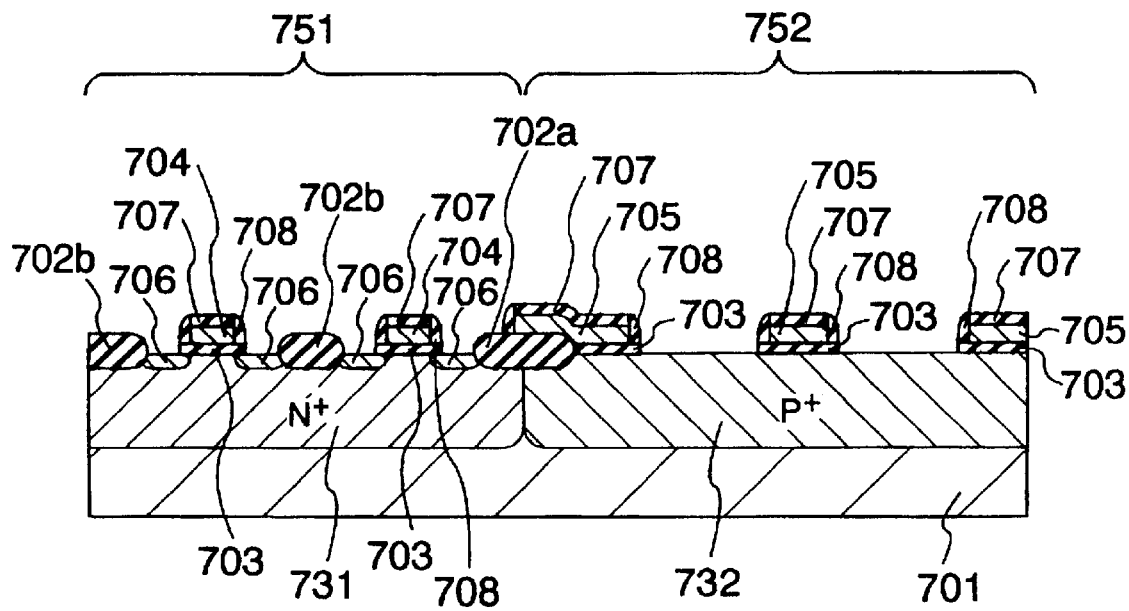

Next, as shown in FIG. 7d, a silicon dioxide film 708 having a film thickness of about 100 to about 200 nm is deposited to the entire surface by the CVD method, and the silicon dioxide film 708 and gate oxide film 703 are etched back until the surface of the silicon substrate 701 is exposed in the N well 731 and the P well 732. In this way, a sidewall oxide film comprising the silicon dioxide film 708 is formed on the side surface of the gate electrode 704 and the silicon dioxide film 707, and on the side surface of the shield gate electrode 705 and the silicon dioxide film 707.

Figure 7E:
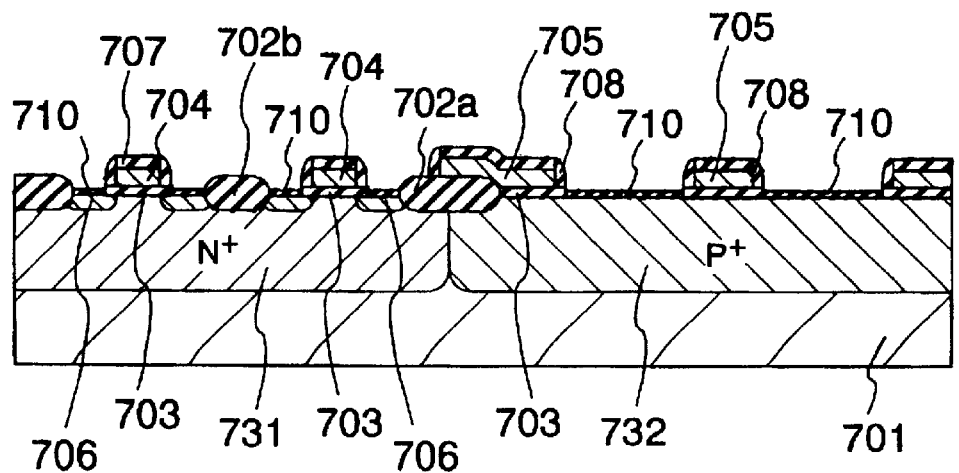

A gate oxide film 710 having a film thickness of about 11 nm is then formed by thermal oxidation on the surfaces of the N and P wells 731 and 732 in the regions where the silicon substrate 701 is exposed, as shown in FIG. 7e.

Figure 7F:
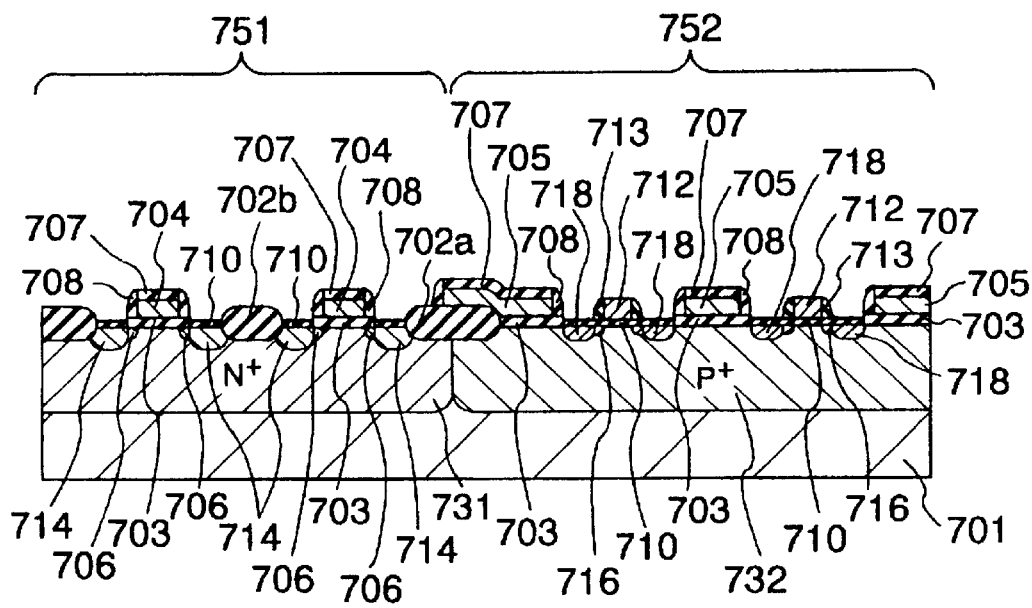

Next, as shown in FIG. 7f, a poly-silicon film having a film thickness of about 200 to about 400 nm is deposited to the entire surface by the CVD process and is then patterned into the pattern of the gate electrode 712 of the MOS transistor in the memory cell array formation section 752. Next, N type impurity ions are implanted into the P well 732 by using a photoresist (not shown) shaped into such a pattern as to cover the peripheral circuit formation section 751, the shield gate electrode 705 and the gate electrode 712 as the mask, and in this way, the N type low concentration impurity diffusion layers (LDD layers) 716 are formed in the surface portion of the P wells 732 on both sides the gate electrode 712.

Further, the silicon dioxide film formed on the entire surface is etched back, and N type impurity ions are then implanted into the P well 732 by using the resulting sidewall oxide film 713 on the side surface of the gate electrode 712 as a new mask. In this way, a pair of N type high concentration impurity diffusion layers 718 which are to serve as the source and the drain of the MOS transistor are formed on the surface portion of the P wells 732 on both sides of the gate electrode 712.

Next, P type impurity ions are implanted into the N well 731 by using a photoresist (not shown) formed in such a manner as to cover the memory cell array formation section 752, the field oxide films 702a and 702b, the gate electrode 704 and the silicon dioxide film 708 as the mask. In this way, a pair of P type high concentration impurity diffusion layers 714 which are to serve as the source and the drain of the MOS transistor are formed on the surface portion of the N wells 731 on both sides of the gate electrode 704.

Figure 7G:
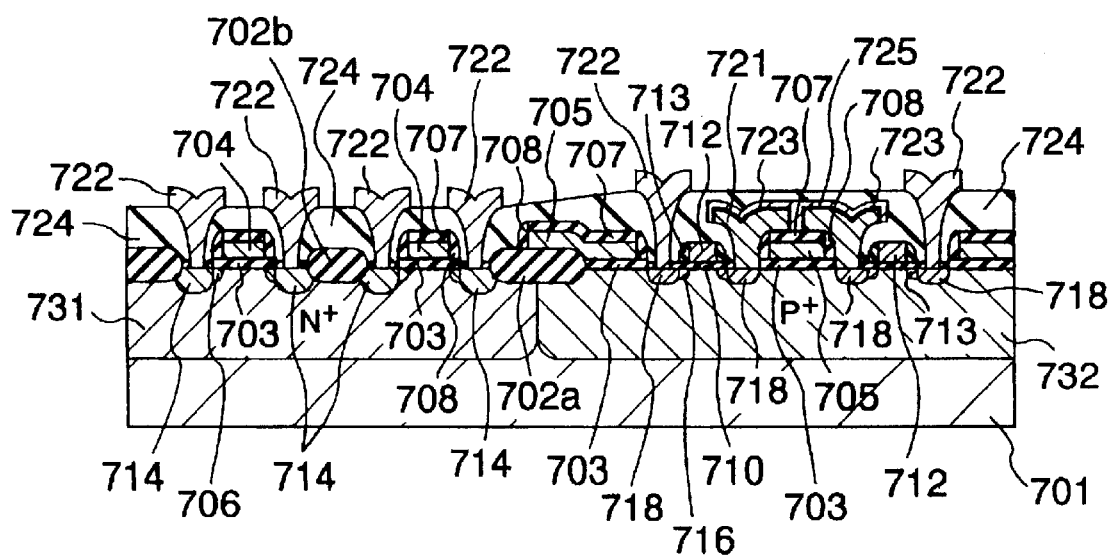

Next, a capacitor comprising a lower electrode 721 connected to one of the source and the drain of the MOS transistor, a capacitor dielectric film 723 such as an ONO film and an upper electrode opposing the lower electrode 721 through the capacitor dielectric film 723 is formed as shown in FIG. 7g. After the entire surface is covered with an insulating film 724, a leading-out electrode 722 is formed at the source/drain of the MOS transistor. Thereafter, known process steps such as the formation of a protective film are carried out, and the DRAM according to this embodiment is manufactured.

In the DRAM manufactured by the method according to this embodiment, a low voltage of about 3.3 V obtained by lowering a 5 V voltage supplied from outside is applied to the gate electrode 712 of the MOS transistor in order to insure the reliable operation of the miniaturized MOS transistors constituting the memory cell array section (752). Therefore, the gate oxide film 710 is formed to a small thickness of about 11 nm. On the other hand, because the 5 V voltage supplied from outside is as such applied to the gate electrode 704 of the MOS transistors constituting the peripheral circuit section (751), the gate oxide film 703 is formed to a relatively large thickness of about 20 to about 30 nm in such a manner that the MOS transistors are not broken even when the 5 V voltage is applied. In this way, reliability of the MOS transistors can be improved.

In the peripheral circuit section, the MOS transistors are electrically isolated from one another by the field oxide film 702 having a relatively large film thickness and in the memory cell array section, on the other hand, the MOS transistors are electrically isolated from one another by the shield gate electrode 705 kept at the same potential as that of the P well 732, for example. Therefore, isolation can be attained by a small isolation width in the peripheral circuit section (751) where a large number of CMOS circuits are formed, without the necessity of disposing a guard ring, etc, whereas in the memory cell array section (752) where a large number of N channel MOS transistors are formed, enlargement of the isolation width due to the bird's beaks and the narrow channel effect due to ion implantation for the channel stop do not occur, and the leakage current of the diffusion layers can be checked.

In the method of this embodiment, the gate electrode 704 and the shield gate electrode 705 are formed by patterning the same poly-silicon film, and the gate electrode 704 and the insulating film formed below the shield gate electrode 705 are the gate oxide film 703. Therefore, the DRAM of the type wherein the gate oxide films in the peripheral circuit section (751) and the memory cell array section (752) have mutually different film thickness can be manufactured, by a smaller number of process steps.

Since the gate oxide film 703 is removed simultaneously with etch-back for forming the sidewall oxide film comprising the silicon dioxide film 708, the shield gate electrode 705 is not exposed as the silicon dioxide films 707 and 708 on the shield gate electrode 705 are removed. In other words, short-circuit between the shield gate electrode 705 and other conductor films can be prevented.

Though this embodiment relates to the manufacture of the DRAM, the present invention can be applied to the manufacture of non-volatile semiconductor memory devices having floating gate type memory cell transistors, logical integrated circuit devices, and other semiconductor devices, by conducting isolation by both of the LOCOS method and field-shield method so that the film thickness of the gate insulating film is different in the respective regions.

What is claimed is:

1. A method of manufacturing a semiconductor device having an isolation structure using a field oxide film and an isolation structure using a shield gate electrode, comprising the steps of:

forming field oxide films at a main surface of a semiconductor substrate by selective thermal oxidation;

forming a first gate insulating film at the main surface of said substrate at portion where said field oxide films are not formed;

patterning and forming a first conductor film to serve as a first gate electrode and a shield gate electrode on said first gate insulating film;

removing said first gate insulating film in a region where said first conductor film is not formed to expose said substrate;

forming a second gate insulating film on said substrate so exposed; and patterning and forming a second conductor film to serve as a second gate electrode on said second gate insulating film.

2. A method of manufacturing a semiconductor device according to claim 1, wherein said second gate insulating film is thinner than said first gate insulating film.

* * * * *